United States Patent
Huang

(10) Patent No.: US 12,148,461 B2
(45) Date of Patent: Nov. 19, 2024

(54) SIGNAL SAMPLING CIRCUIT AND SEMICONDUCTOR MEMORY DEVICE

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 250 days.

(21) Appl. No.: 17/949,257

(22) Filed: Sep. 21, 2022

(65) Prior Publication Data
US 2023/0013811 A1    Jan. 19, 2023

Related U.S. Application Data

(63) Continuation of application No. PCT/CN2022/089853, filed on Apr. 28, 2022.

(30) Foreign Application Priority Data

Mar. 23, 2022    (CN) .......................... 202210292978.4

(51) Int. Cl.
*G11C 11/4076* (2006.01)
*G06F 1/04* (2006.01)
(Continued)

(52) U.S. Cl.
CPC ............ *G11C 11/4076* (2013.01); *G06F 1/04* (2013.01); *G11C 7/10* (2013.01); *G11C 7/1087* (2013.01);
(Continued)

(58) Field of Classification Search
CPC ....... G11C 11/4076; G11C 7/10; G11C 7/109; G11C 7/1093; G11C 8/10; G11C 8/12;
(Continued)

(56) References Cited

U.S. PATENT DOCUMENTS 10,176,858 B1 * 1/2019 Wilmoth ................ G11C 7/109
10,679,683 B1    6/2020 Chen
(Continued)

FOREIGN PATENT DOCUMENTS

WO    2019045796 A1    3/2019

OTHER PUBLICATIONS

European Patent Office, Extended European Search Report Issued in Application No. 22932848.9, May 31, 2024, Germany, 8 pages.

*Primary Examiner* — Huan Hoang
*Assistant Examiner* — Justin Bryce Heisterkamp
(74) *Attorney, Agent, or Firm* — Kilpatrick Townsend & Stockton LLP

(57) ABSTRACT

A signal sampling circuit and a semiconductor memory device are provided. The signal sampling circuit includes a signal input circuit, configured to determine a to-be-processed command signal and a to-be-processed chip select signal; a mode selection circuit, configured to determine a target mode clock signal and a target mode chip select signal according to the mode selection signal; a first clock processing circuit, configured to perform sampling and logic operation on the to-be-processed chip select signal and the target mode chip select signal according to the target mode clock signal, to obtain a first chip select clock signal; a second clock processing circuit, configured to perform sampling and logic operation on the to-be-processed chip select signal and the target mode chip select signal according to the target mode clock signal, to obtain a second chip select clock signal; and a command decoding circuit, configured to determine a target command signal.

20 Claims, 11 Drawing Sheets

(51) Int. Cl.
  *G11C 7/10*      (2006.01)
  *G11C 8/10*      (2006.01)
  *G11C 8/12*      (2006.01)
  *G11C 8/18*      (2006.01)
  *G11C 11/4063*   (2006.01)
  *G11C 11/4093*   (2006.01)
  *H03K 3/037*     (2006.01)
  *H03K 5/135*     (2006.01)
  *H03K 19/20*     (2006.01)
  *G11C 8/06*      (2006.01)
  *G11C 11/408*    (2006.01)

(52) U.S. Cl.
  CPC ............ *G11C 7/109* (2013.01); *G11C 7/1093* (2013.01); *G11C 8/10* (2013.01); *G11C 8/12* (2013.01); *G11C 8/18* (2013.01); *G11C 11/4063* (2013.01); *G11C 11/4093* (2013.01); *H03K 3/037* (2013.01); *H03K 5/135* (2013.01); *H03K 19/20* (2013.01); *G11C 8/06* (2013.01); *G11C 11/408* (2013.01)

(58) Field of Classification Search
  CPC ... G11C 8/18; G11C 11/4063; G11C 11/4093; G11C 8/06; G11C 11/408; G11C 7/1087; G11C 11/413; G06F 1/04; H03K 3/037; H03K 5/135; H03K 19/20
  See application file for complete search history.

(56) References Cited

U.S. PATENT DOCUMENTS

| | | | |
|---|---|---|---|
| 11,615,821 B1 * | 3/2023 | Sreeram | G11C 7/1009 |
| | | | 365/233.1 |
| 2019/0180803 A1 * | 6/2019 | Jung | G11C 7/1015 |
| 2021/0394339 A1 | 12/2021 | Howe | |

* cited by examiner

SIGNAL SAMPLING CIRCUIT AND SEMICONDUCTOR MEMORY DEVICE

CROSS-REFERENCE TO RELATED APPLICATIONS

This is a continuation of International Patent Application No. PCT/CN2022/089853, filed on Apr. 28, 2022, which claims priority to Chinese patent application No. 202210292978.4, filed on Mar. 23, 2022 and entitled "SIGNAL SAMPLING CIRCUIT AND SEMICONDUCTOR MEMORY DEVICE". The disclosures of International Patent Application No. PCT/CN2022/089853 and Chinese patent application No. 202210292978.4 are hereby incorporated by reference in their entireties.

TECHNICAL FIELD

The disclosure relates to the technical field of integrated circuits, and in particular to a signal sampling circuit and a semiconductor memory device.

BACKGROUND

With continuous development of the semiconductor technology, people have increasingly high requirements on the data transmission rate when manufacturing and using devices such as computers. In order to achieve a higher data transmission rate, a series of memory devices have been developed in which transmission can be conducted at Double Data Rate (DDR).

In a Dynamic Random Access Memory (DRAM) chip, a Command/Address (CMD/ADD or CA for short) signal may be sampled as an address and may also be sampled and decoded as a command. At present, the DRAM has one-cycle mode (1N MODE) and two-cycle mode (2N MODE). The chip select signals used by a 2T CMD signal have different pulse shape in different cycle modes, and the chip select signals used by an NT ODT CMD signal have different pulse shape in different cycle modes, and operation functions corresponding to the two cycle modes are also different. However, in an existing command decoding solution, it is necessary to arrange separate decoding circuits for command signals in different modes, so that the circuit area is too large, and the signal decoding processes of different commands are prone to being confused, resulting in decoding errors.

SUMMARY

According to a first aspect, embodiments of the present disclosure provide a signal sampling circuit. The signal sampling circuit may include a signal input circuit, a mode selection circuit, a first clock processing circuit, a second clock processing circuit and a command decoding circuit.

The signal input circuit is configured to determine a to-be-processed command signal and a to-be-processed chip select signal according to a first clock signal, a first chip select signal and a first command address signal. Herein, the clock cycle of the first clock signal is twice the preset clock cycle.

The mode selection circuit is configured to perform, in the case where a mode selection signal indicates a target mode, selection processing on the first clock signal and the to-be-processed chip select signal according to the mode selection signal to obtain a target mode clock signal and a target mode chip select signal.

The first clock processing circuit is configured to perform, when the first chip select signal includes a pulse with a pulse width of a preset clock cycle, sampling and logic operation processing on the to-be-processed chip select signal and the target mode chip select signal according to the target mode clock signal to obtain a first chip select clock signal.

The second clock processing circuit is configured to perform, when the first chip select signal includes a pulse with a pulse width that is twice the preset clock cycle, or the first chip select signal includes two pulses, each with a pulse width of the preset clock cycle, sampling and logic operation processing on the to-be-processed chip select signal and the target mode chip select signal according to the target mode clock signal to obtain a second chip select clock signal.

The command decoding circuit is configured to perform decoding and sampling processing on the to-be-processed command signal according to the to-be-processed chip select signal and the first chip select clock signal to obtain a target command signal; or, perform decoding and sampling processing on the to-be-processed command signal according to the to-be-processed chip select signal and the second chip select clock signal to obtain a target command signal.

According to a second aspect, the embodiments of the disclosure provide a semiconductor memory device, which may include a signal sampling circuit as in the first aspect.

DETAILED DESCRIPTION

Figure 1:
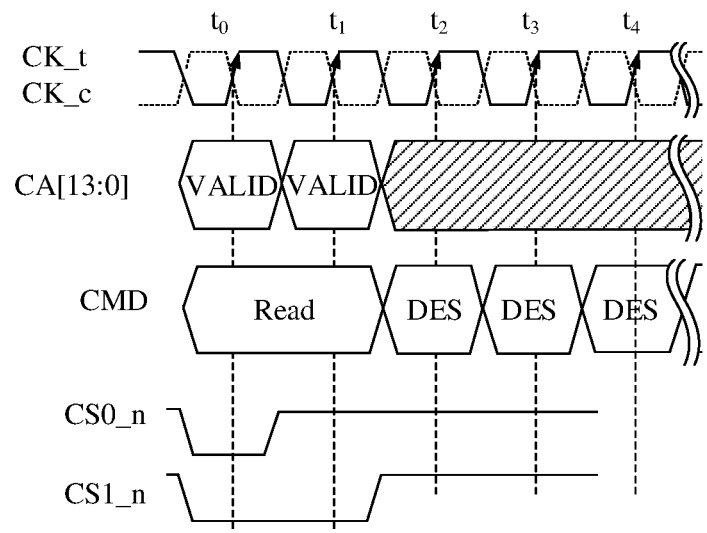
FIG. 1 is a schematic diagram of a decoding timing sequence of different command signals in a 1N MODE.

Technical solutions in the embodiments of the disclosure are clearly and completely described below in combination with the drawings in the embodiments of the disclosure. It can be understood that the specific embodiments described herein are merely illustrative of the disclosure and are not intended to limit the disclosure. In addition, it is also to be noted that, for ease of description, only the parts related to the relevant disclosure are shown in the drawings.

Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure.

"Some embodiments" involved in the following descriptions describes a subset of all possible embodiments. However, it can be understood that "some embodiments" may be the same subset or different subsets of all the possible embodiments, and may be combined without conflicts.

It is to be pointed out that terms "first/second/third" involved in the embodiments of the disclosure are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

The following is the explanation of technical terms involved in the embodiments of the disclosure and the corresponding relationship of some terms:

Dynamic Random Access Memory (DRAM)
Synchronous Dynamic Random Access Memory (SDRAM)
Double Data Rate (DDR)
4th DDR (DDR4)
5th DDR (DDR5)
Command/Address (CMD/ADD or CA for short)
Clock Input (CLK)
Chip Select Input (CS)
Buffer/Repeater (RPT)
On-Die Termination (ODT)
Command Decoder (CMD DEC)
Data Flip-Flop or Delay Flip-Flop (DFF)
Process Voltage Temperature (PVT)
2Tck Command (2T CMD)
Non-Target On-Die Termination Command (NT ODT CMD)

It is to be understood that taking DDR5 DRAM design as an example, CA input may be sampled as an address and may also be sampled and decoded as a command Herein, CA here is a general name of various command address signals of a DRAM, which may include command signals such as a Row Address Strobe (RAS), a Column Address Strobe (CAS), a Write command (WE), and a Read command (RD), and may further include address signals of A13 to A0. In addition, in practical application, the number of bits included in the command address signal may be specifically determined according to the specification of the DRAM, and is not limited at all in the embodiments of the present disclosure.

The embodiments of the disclosure are directed to relevant circuits in which sampling and processing is performed by taking CA as a command Therefore, the process of sampling and processing by taking CA as a command is briefly described below.

Figure 2:
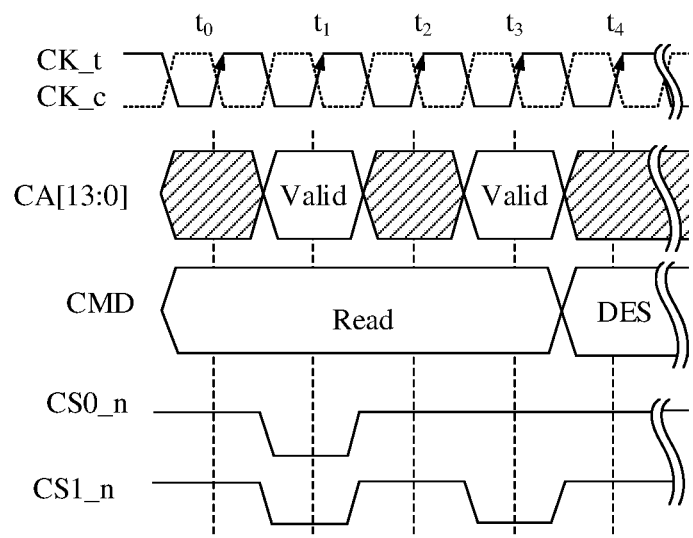
FIG. 2 is a schematic diagram of a decoding timing sequence of different command signals in a 2N MODE.

The DDR5 DRAM has a one-cycle mode (represented by 1N MODE) and a two-cycle mode (represented by 2N MODE), and has two types of command signals, i.e., 2T CMD signal and NT ODT CMD signal. Herein, the 2T CMD signal may also be called 2-cycle Command signal. With reference to FIG. 1 and FIG. 2, the decoding timing sequences of the 2T CMD signal and the NT ODT CMD signal in different cycle modes are described below respectively.

Referring to FIGS. 1 and 2, CK_t and CK_c are a pair of input complementary clock signals, and the clock cycle of CK_t and CK_c is a preset clock period, CK_t and CK_c has a phase difference of 180 degrees. CA [13:0] is a CA signal input, where CA[13:0] represents a group of signals, and is a combined general name of CA [0], CA [1], . . . , CA [13]. For the 2T CMD signal, a chip select signal corresponding to the 2T CMD signal is represented by $CS0\_n$. For the NT ODT CMD signal, a chip select signal corresponding to the NT ODT CMD signal is represented by $CS1\_n$. The CMD signal is a signal obtained by decoding the CA signal as a command Here, the chip select signal is a signal indicating that a target chip is selected.

As shown in FIG. 1, in the 1N MODE, for the 2T CMD signal, a $CS0\_n$ signal is a low active pulse signal. The $CS0\_n$ signal includes a pulse with a pulse width of the preset clock period. The CA [13:0] signal includes valid signals in two consecutive preset clock cycles. A CA [4:0] signal in a first clock cycle needs to be sampled and decoded as a command to obtain a 2T CMD signal lasting for two preset clock cycles. Here, CA [13:0] represents a group of signals, and is a combined general name of CA [0], CA [1], . . . , CA [13]. CA [4:0] refers to five signals of CA [0], CA [1], CA [2], CA [3] and CA [4] in CA [13:0]. For the NT ODT CMD signal, a $CS0\_n$ signal is a low active pulse signal. The $CS1\_n$ signal includes a pulse with a pulse width that is twice the preset clock cycle. The CA [13:0] signal includes valid signals in two consecutive preset clock cycles. The CA [4:0] signal in the first clock cycle needs to be sampled and decoded as a command signal to obtain a NT ODT CMD signal lasting for two preset clock cycles.

As shown in FIG. 2, in the 2N MODE, for the 2T CMD signal, a $CS0\_n$ signal is a low active pulse signal. The $CS0\_n$ signal includes a pulse with a pulse width of the preset clock period. The CA [13:0] signal includes valid signals of two nonconsecutive preset clock cycles. The CA [4:0] signal in the first clock cycle further needs to be sampled and decoded as a command signal to obtain the 2T CMD signal. For the NT ODT CMD signal, $CS0\_n$ is a low active pulse signal. The $CS0\_n$ includes two pulses, each with a pulse width of the preset clock cycle. The CA [13:0] signal includes valid signals in two nonconsecutive preset clock cycles. The CA [4:0] in the first clock cycle needs to be sampled and decoded as a command signal to obtain the NT ODT CMD signal.

That is, in the 1N MODE, if there is a pulse in the CS_n signal with a pulse width of the preset clock cycle, the CA input needs to be decoded to obtain the 2T CMD signal. If there is a pulse in the CS_n signal with a pulse width of twice the preset clock period, the CA input needs to be decoded to obtain the NT ODT CMD signal. In the 2N MODE, if there is a pulse in the CS_n signal with a pulse width of the preset clock cycle, the CA input needs to be decoded to obtain the 2T CMD signal. If there are two pulses in the CS_n signal with a pulse width of the preset clock period, the CA input needs to be decoded to obtain the NT ODT CMD signal.

Although the 2T CMD signal and the NT ODT CMD signal are the same for decoding commands such as a RD command and a WE command, the CS_n signal has different states and the two signals have different operation functions. For example, for the RD command, the 2T CMD signal needs to be subjected to a read operation, but the NT ODT CMD signal only needs to be subjected to an ODT operation matching with the read operation without performing the read operation. Therefore, in practical application, it is necessary to distinguish the decoding of the 2T CMD signal and the NT ODT CMD signal. However, the CS_n signals corresponding to different command signals have complex changes due to different cycle patterns, causing the decoding circuit of CA to be more complex.

Based thereon, the embodiments of the present disclosure provide a signal sampling circuit. The signal sampling circuit includes a signal input circuit, a mode selection circuit, a first clock processing circuit, a second clock processing circuit and a command decoding circuit. Herein, the signal input circuit is configured to determine a to-be-processed command signal and a to-be-processed chip select signal according to a first clock signal, a first chip select signal and a first command address signal. Herein, the clock cycle of the first clock signal is twice the preset clock cycle. The mode selection circuit is configured to perform, in the case where a mode selection signal indicates a target mode, selection on the first clock signal and the to-be-processed chip select signal according to the mode selection signal, to obtain a target mode clock signal and a target mode chip select signal. The first clock processing circuit is configured to perform, when the first chip select signal includes a pulse with a pulse width of a preset clock cycle, a sampling and logic operation on the to-be-processed chip select signal and the target mode chip select signal according to the target mode clock signal, to obtain a first chip select clock signal. The second clock processing circuit is configured to perform, when the first chip select signal includes a pulse with a pulse width that is twice the preset clock cycle, or the first chip select signal includes two pulses, each with a pulse width of the preset clock cycle, a sampling and logic operation on the to-be-processed chip select signal and the target mode chip select signal according to the target mode clock signal, to obtain a second chip select clock signal. The command decoding circuit is configured to perform decoding and sampling on the to-be-processed command signal according to the to-be-processed chip select signal and the first chip select clock signal, to obtain a target command signal; or, perform decoding and sampling on the to-be-processed chip select signal and the second chip select clock signal, to obtain a target command signal. Thus, based on the signal sampling circuit, a target mode clock signal and a target mode chip select signal are determined according to a cycle mode of the signal sampling circuit, so that corresponding first chip select clock signal and second chip select clock signal are obtained for the first chip select signal with different pulse shapes. Therefore, 2T CMD and NT ODT CMD are correctly distinguished and accurately decoded in different cycle modes, the problem of executing a wrong operation caused by a command decoding error can be avoided, and meanwhile, the circuit area is saved and the power consumption is reduced.

Various embodiments of the present disclosure will now be described in detail in combination with the accompanying drawings.

Figure 3:
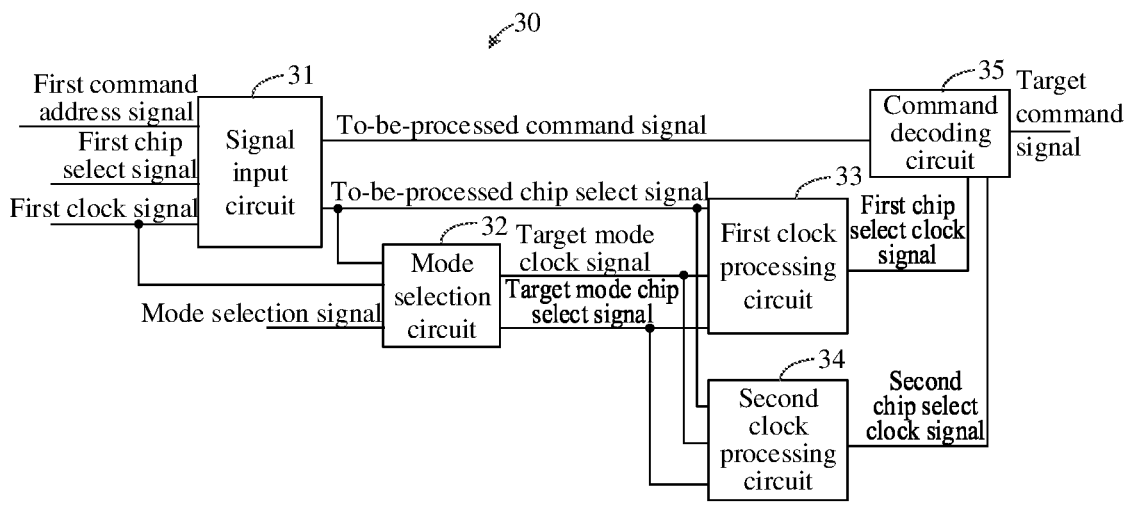
FIG. 3 is a composition structure diagram of a signal sampling circuit according to an embodiment of the present disclosure.

In an embodiment of the disclosure, referring to FIG. 3, FIG. 3 shows a diagram of a structure of a signal sampling circuit according to an embodiment of the present disclosure. As shown in FIG. 3, the signal sampling circuit 30 may include a signal input circuit 31, a mode selection circuit 32, a first clock processing circuit 33, a second clock processing circuit 34 and a command decoding circuit 35.

The signal input circuit 31 is configured to determine a to-be-processed command signal and a to-be-processed chip select signal according to a first clock signal, a first chip select signal and a first command address signal. Herein, the clock cycle of the first clock signal is twice the preset clock cycle.

The mode selection circuit 32 is configured to perform, in the case where a mode selection signal indicates a target mode, selection on the first clock signal and the to-be-processed chip select signal according to the mode selection signal, to obtain a target mode clock signal and a target mode chip select signal.

The first clock processing circuit 33 is configured to perform, when the first chip select signal includes a pulse with a pulse width of a preset clock cycle, a sampling and logic operation on the to-be-processed chip select signal and the target mode chip select signal according to the target mode clock signal, to obtain a first chip select clock signal.

The second clock processing circuit 34 is configured to perform, when the first chip select signal includes a pulse with a pulse width that is twice the preset clock cycle, or the first chip select signal includes two pulses, each with a pulse width of the preset clock cycle, a sampling and logic operation on the to-be-processed chip select signal and the target mode chip select signal according to the target mode clock signal, to obtain a second chip select clock signal.

The command decoding circuit 35 is configured to perform decoding and sampling on the to-be-processed command signal according to the to-be-processed chip select signal and the first chip select clock signal, to obtain a target command signal; or perform decoding and sampling on the to-be-processed command signal according to the to-be-processed chip select signal and the second chip select clock signal, to obtain a target command signal.

It is to be noted that, in the embodiment of the present disclosure, the signal sampling circuit 30 is applied to a sampling and decoding process of an address and command signal, and may be specifically applied to various circuit scenarios. In the embodiment of the disclosure, explanation and description are made below with a CA signal in a DRAM chip for address and command sampling and decoding, which, however, does not constitute a relevant limitation.

It is also to be noted that, in the embodiment of the present disclosure, the signal sampling circuit 30 is applied to a two-cycle command scenario. Specifically, in the scenario, the first command address signal here includes valid signals in two preset clock cycles, and the two preset clock cycles may be consecutive or may be nonconsecutive. As shown in FIG. 1 and FIG. 2, a CA [13:0] signal may be valid in two consecutive preset clock cycles, or may be valid in two nonconsecutive preset clock cycles, where the preset clock cycle refers to the clock cycle of a CK_t/CK_c signal.

In the embodiment of the present disclosure, the target command signal may be a Command signal in a DDR5 DRAM chip. Since the valid pulse of the signal lasts for two clock cycles, the Command signal may be simply referred to as a 2T CMD signal here. The 2T CMD signal may include a RD command signal, a WE command signal, a refresh command signal, a precharge command signal, an activation command signal, etc. Or, the target command signal may also be a Non-Target ODT Command signal in the DDR5 DRAM chip, which may be simply referred to as a NT ODT CMD signal.

During command sampling and decoding, in order to distinguish the 1N MODE and the 2N MODE, a mode selection circuit 32 is added in the embodiment of the disclosure, and a target mode clock signal and a target mode chip select signal corresponding to the target mode are determined through the mode selection circuit 32. In addition, in order to distinguish the sampling and decoding processes of the 2T CMD signal and the NT ODT CMD signal, a first clock processing circuit 33 and a second clock processing circuit 34 are added in the embodiment of the disclosure, and the first clock processing circuit 33 and the second clock processing circuit 34 respectively perform the sampling and logic operation on the to-be-processed chip select signal according to the target mode clock signal and the target chip select signal, to obtain a first chip select clock signal and a second chip select clock signal which are different from each other. Here, at most, only one of the first chip select clock signal and the second chip select clock signal is a valid signal, and can indicate different commands (the 2T CMD signal or the NT ODT CMD signal). Then, the decoding and sampling process is performed according to the first chip select clock signal and the second chip select clock signal to obtain a target command signal. Thus, through the signal sampling circuit 30, the decoding of the two command signals, 2T CMD and NT ODT CMD, can be correctly distinguished in different cycle modes. Meanwhile, the 1N MODE and the 2N MODE share a set of decoding circuits, which not only saves the circuit area but also reduces power consumption.

It is to be noted that, for the pulse width described in the embodiment of the disclosure, "the pulse width is twice the preset clock cycle" specifically means that the difference between the pulse width and twice of the preset clock cycle is within a preset precision range. The explanation of the multiple relationship between the pulse width of other signals and the preset clock cycle involved in the disclosure may also be understood in a similar manner In one implementation mode, in the case where the target mode is a 1N MODE, the first clock processing circuit 33 is configured to perform, when a first chip select signal includes a pulse with a pulse width of a preset clock period, sampling and logic operation on the to-be-processed chip select signal and a target mode chip select signal corresponding to the 1N MODE according to a target mode clock signal corresponding to the 1N MODE, to obtain a first chip select clock signal. The second clock processing circuit 34 is configured to perform, when the first chip select signal includes a pulse with a pulse width that is twice the preset clock period, sampling and logic operation on the to-be-processed chip select signal and the target mode chip select signal corresponding to the 1N MODE according to the target mode clock signal corresponding to the 1N MODE, to obtain a second chip select clock signal.

In another implementation mode, in the case where the target mode is a 2N MODE, the first clock processing circuit 33 is configured to perform, when a first chip select signal includes a pulse with a pulse width of a preset clock period, sampling and logic operation on the to-be-processed chip select signal and a target mode chip select signal corresponding to the 2N MODE according to a target mode clock signal corresponding to the 2N MODE, to obtain a first chip select clock signal. The second clock processing circuit 34 is configured to perform, when the first chip select signal includes two pulses, each with a pulse width of the preset clock period, sampling and logic operation on the to-be-processed chip select signal and the target mode chip select signal corresponding to the 2N MODE according to the target mode clock signal corresponding to the 2N MODE, to obtain a second chip select clock signal.

It is to be noted that, in the embodiment of the present disclosure, when the first chip select signal includes a pulse with a pulse width of the preset clock period, the first chip select clock signal obtained according to the first clock processing circuit 33 is a valid signal, while the second chip select clock signal obtained according to the second clock processing circuit 34 is an invalid signal. In addition, in this case, the target command signal is a 2T CMD signal.

It is also to be noted that, in the embodiment of the present disclosure, when the first chip select signal includes a pulse with a pulse width of two preset clock cycles, or the first chip select signal includes two pulses, each with a pulse width of the preset clock cycle, the first chip select signal obtained according to the first clock processing circuit 33 is an invalid signal, while the second chip select clock signal obtained according to the second clock processing circuit 34 is a valid signal. In addition, in this case, the target command signal is a NT ODT CMD signal.

That is, regardless of in the 1N MODE or in the 2N MODE, the 2T CMD signal is obtained by decoding according to the first chip select clock signal, and the NT ODT CMD signal is obtained by decoding according to the second chip select clock signal, so that different commands can be distinguished.

Figure 4:
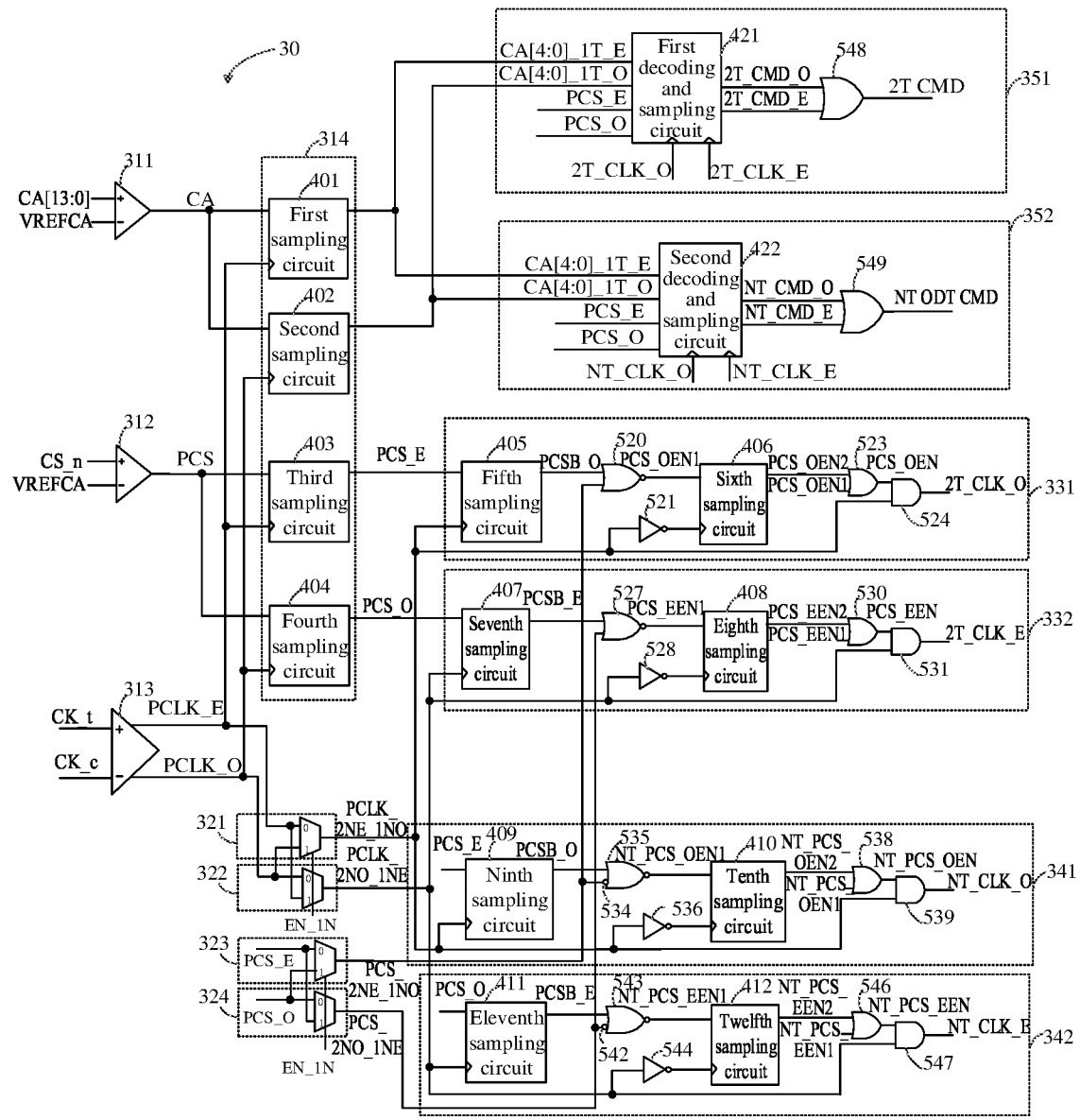
FIG. 4 is a composition structure diagram of another signal sampling circuit according to an embodiment of the present disclosure.

In some embodiments, based on the signal sampling circuit 30 shown in FIG. 3, as shown in FIG. 4, the signal input circuit 31 may include a first receiving circuit 311, a second receiving circuit 312, a third receiving circuit 313 and an input sampling circuit 314.

The first receiving circuit 311 is configured to receive an initial command address signal and output a first command address signal.

The second receiving circuit 312 is configured to receive an initial chip select signal and output a first chip select signal.

The third receiving circuit 313 is configured to receive the initial clock signal, perform frequency division on the initial clock signal, and output a first odd clock signal and a first even clock signal.

The input sampling circuit 314 is configured to perform sampling on the first chip select signal and the first command address signal according to the first clock signal, to obtain a to-be-processed chip select signal and a to-be-processed command signal.

Herein, the clock cycle of the initial clock signal is a preset clock cycle, the first clock signal is composed of the first odd clock signal and the first even clock signal, the respective clock cycles of the first odd clock signal and the first even clock signal are twice the preset clock cycle, and the phase difference between the first odd clock signal and the first even clock signal is 180 degrees. That is, the first odd clock signal and a second even clock signal are obtained after the initial clock signal is subjected to the frequency division.

It is to be noted that either the first receiving circuit 311, the second receiving circuit 312 or the third receiving circuit 313 may be a receiver (represented by Receiver) or may be a buffer (represented by Buffer).

It is also to be noted that in FIG. 4, the initial command address signal here may be represented by CA [13:0], and the first command address signal is represented by CA. The initial chip select signal may be represented by CS_n, and the first chip select signal is represented by PCS. The initial clock signal may be represented by CK_t and CK_c, the first even clock signal is represented by PCLK_E, and the first odd clock signal is represented by PCLK_O. In addition, VREFCA in FIG. 4 represents a reference signal.

It is also to be noted that, in the embodiment of the present disclosure, neither the initial command address signal nor the first command address signal is a single signal, but represents a group of command address signals, namely CA [0]~CA [13]. Therefore, the first receiving circuit 311 may include 14 receiving circuits configured to receive 14 signals CA [0], CA [1], . . . , CA [13], and only one receiving circuit is shown in the figure for illustration.

For the input sampling circuit 314, in the embodiment of the present disclosure, the first clock signal is used to perform sampling on the first command address signal and the first chip select signal respectively. Therefore, in some embodiments, based on the signal sampling circuit 30 shown in FIG. 3, as shown in FIG. 4, the input sampling circuit 314 includes a first sampling circuit 401, a second sampling circuit 402, a third sampling circuit 403 and a fourth sampling circuit 404.

The first sampling circuit 401 is configured to perform sampling on the first command address signal according to the first even clock signal, to obtain a to-be-processed even command signal.

The second sampling circuit 402 is configured to perform sampling on the first command address signal according to the first odd clock signal, to obtain a to-be-processed odd command signal.

The third sampling circuit 403 is configured to perform sampling and phase inverting on the first chip select signal according to the first even clock signal, to obtain a to-be-processed even chip select signal.

The fourth sampling circuit 404 is configured to perform sampling and phase inverting on the first chip select signal according to the first odd clock signal, to obtain the to-be-processed odd chip select signal.

Here, the to-be-processed command signal may be composed of the to-be-processed even command signal and the to-be-processed odd command signal, and the to-be-processed chip select signal may be composed of the to-be-processed even chip select signal and the to-be-processed odd chip select signal.

In FIG. 4, the to-be-processed even command signal is represented by CA [4:0]_1T_E, the to-be-processed odd command signal is represented by CA [4:0]_1T_O, the to-be-processed even chip select signal is represented by PCS_E, and the to-be-processed odd chip select signal is represented by PCS_O.

Figure 5:
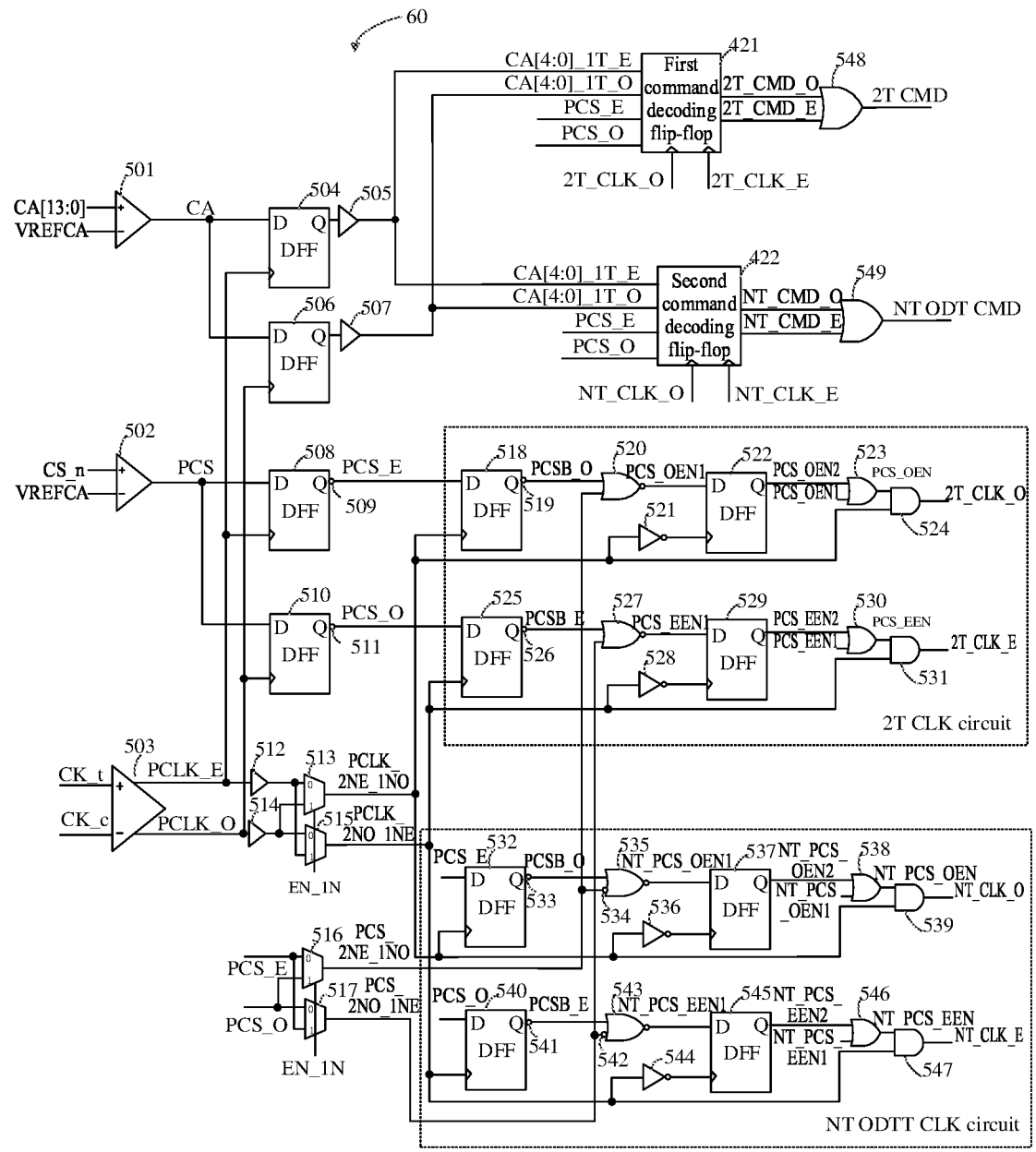
FIG. 5 is a composition structure diagram of yet another signal sampling circuit according to an embodiment of the present disclosure.

It is to be noted that, in a specific embodiment, based on the signal sampling circuit 30 shown in FIG. 4, as shown in FIG. 5, the first sampling circuit 401 may include a first flip-flop 504, an input end of the first flip-flop 504 is connected to the first command address signal, a clock end of the first flip-flop 504 is connected to the first even clock signal, and an output end of the first flip-flop 504 is configured to output the to-be-processed even command signal.

The second sampling circuit 402 may include a second flip-flop 506, the input end of the second flip-flop 506 is connected to the first command address signal, the clock end of the second flip-flop 506 is connected to the first odd clock signal, and the output end of the second flip-flop 506 is configured to output the to-be-processed odd command signal.

The third sampling circuit 403 includes a third flip-flop 508 and a first inverter 509. The input end of the third flip-flop 508 is connected to the first chip select signal, the clock end of the third flip-flop 508 is connected to the first even clock signal, and the output end of the third flip-flop 508 is connected to the input end of the first inverter 509, and the output end of the first inverter 509 is configured to output the to-be-processed even chip select signal.

The fourth sampling circuit 404 includes a fourth flip-flop 510 and a second inverter 511. The input end of the fourth flip-flop 510 is connected to the first chip select signal, the clock end of the fourth flip-flop 510 is connected to the first odd clock signal, and the output end of the fourth flip-flop 510 is connected to the input end of the second inverter 511, and the output end of the second inverter 511 is configured to output the to-be-processed chip select signal.

In FIG. 4, the to-be-processed even command address signal is represented by CA [13:0]_1T_E, and the to-be-processed odd command address signal is represented by CA [13:0]_1T_O. Here, CA [13:0]_1T_E is not a single signal, but represents a group of command address signals, namely CA [0]_1T_E~CA [13]_1T_E, and CA [4:0]_1T_E represents five signals of CA [0]_1T_E~. CA [4]_1T_E in the group of signals. CA [13:0]_1T_O is not a single signal either, but represents a group of command address signals, namely CA [0]_1T_O~CA [13]_1T_O, and CA [4:0]_1T_O represents five signals of CA [0]_1T_O~CA [4]_1T_O.

It is to be understood that, for the first sampling circuit 401 or the second sampling circuit 402, since CA is not a single signal, but a general name of a group of signals, a plurality of first sampling circuits 401 may be included here, each configured to receive a respective CA signal in the group of CA signals. Similarly, a plurality of second sampling circuits 402 may also be included, each configured to receive a respective CA signal in the group of CA signals, and only one first sampling circuit 401 and one second sampling circuit 402 are shown in the figure for illustration.

Particularly, as shown in FIG. 5, the first sampling circuit 401 may further include a first buffer 505. At the moment, an input end of the first buffer 505 is connected to the output end of the first flip-flop 504, and an output end of the first buffer 505 is configured to output a CA [4:0]_1T_E signal. The second sampling circuit 402 may further include a second buffer 507. At the moment, an input end of the second buffer 507 is connected to the output end of the second flip-flop 506, and an output end of the second buffer 507 is configured to output a CA [4:0]_1T_0 signal. Thus, through the first buffer 505 and the second buffer 507, delay and drive enhancement are implemented in the signal transmission process.

In the embodiment of the present disclosure, regardless of the first buffer or the second buffer, the number of buffers is not limited to one, and may be multiple. Here, the specific number may be set according to the actual needs, and is not specifically limited.

It is also to be noted that the third sampling circuit 403 performs sampling and inverting on the first chip select signal by using the first even clock signal, to obtain a PCS_O signal. The fourth sampling circuit 404 performs sampling and inverting on the first chip select signal by using the first odd clock signal, to obtain a PCS_E signal.

Here, since the first chip select signal is a low active pulse signal, after the first inverter 509 or the second inverter 511 is added, the PCS_O signal or the PCS_E signal may become a high active pulse signal for subsequent logic operation. In addition, for different circuit application scenarios, the third sampling circuit 403 and the fourth sampling circuit 404 do not have to be provided with the first inverter 509 and the second inverter 511 respectively, and in this case, the subsequent logic operation needs to be adjusted accordingly, which can achieve the same effect.

In some embodiments, based on the signal sampling circuit 30 shown in FIG. 3, as shown in FIG. 4, the mode selection circuit 32 may include a first selection circuit 321, a second selection circuit 322, a third selection circuit 323 and a fourth selection circuit 324.

The first selection circuit 321 is configured to perform selection on the first odd clock signal and the first even clock signal according to the mode selection signal, to obtain a first mode clock signal in a target mode clock signal.

The second selection circuit 322 is configured to perform selection on the first odd clock signal and the first even clock signal according to the mode selection signal, to obtain a second mode clock signal in the target mode clock signal.

The third selection circuit 323 is configured to perform selection on the to-be-processed odd chip select signal and the to-be-processed even chip select signal according to the mode selection signal, to obtain a first mode chip select signal in the target mode chip select signal.

The fourth selection circuit 324 is configured to perform selection on the to-be-processed odd chip select signal and the to-be-processed even chip select signal according to the mode selection signal, to obtain a second mode chip select signal in the target mode chip select signal.

Here, the first mode clock signal and the second mode clock signal constitute the target mode clock signal, and the first mode chip select signal and the second mode chip select signal constitute the target mode chip select signal. In addition, in FIGS. 4 and 5, the mode selection signal may be represented by EN_1N, the first mode clock signal may be represented by PCLK_2NE_1NO, the second mode clock signal may be represented by PCLK_2NO_1NE, the first mode chip select signal may be represented by PCS_2NE_1NO, and the second mode chip select signal may be represented by PCS_2NO_1NE.

Thus, for different cycle modes, the target mode clock signal and the target mode chip select signal are adjusted accordingly, so as to subsequently determine a decoding command as the 2T CMD signal or the NT ODT CMD signal.

In a possible implementation mode, in the case where the mode selection signal indicates a 1N MODE, the mode selection circuit 32 is specifically configured to select a first odd clock signal to generate a first mode clock signal, select a first even clock signal to generate a second mode clock signal, select a to-be-processed odd chip select signal to generate a first mode chip select signal, and select a to-be-processed even chip select signal to generate a second mode chip select signal.

In another possible implementation mode, in the case where the mode selection signal indicates a 2N MODE, the mode selection circuit 32 is specifically configured to select a first even clock signal to generate a first mode clock signal, select a first odd clock signal to generate a second mode clock signal, select a to-be-processed even chip select signal to generate a first mode chip select signal, and select a to-be-processed odd chip select signal to generate a second mode chip select signal.

Thus, by controlling the sources of the first mode clock signal/the second mode clock signal and the first mode chip select signal/the second mode chip select signal, the 1N MODE and the 2N MODE may be distinguished; and on the basis of sharing a subsequent processing and decoding circuit, the decoding object may be distinguished as the 2T CMD signal or the NT ODT CMD signal in different cycle modes.

In some embodiments, if the target mode is the 1N MODE, it is determined that the mode selection signal is in a first level state. Or, if the target mode is the 2N MODE, it is determined that the mode selection signal is in a second level state.

Here, the first level state is different from the second level state. Exemplarily, the first level state is a high level, and the second level state is a low level. Or, the first level state is a low level and the second level state is a high level, and the specific values of the low level or the high level may be determined according to an actual application scenario, which is not limited at all in the embodiment of the present disclosure.

In a specific embodiment, based on the signal sampling circuit 30 shown in FIG. 4, as shown in FIG. 5, the first selection circuit 321 includes a first multiplexer 513, the second selection circuit 322 includes a second multiplexer 515, the third selection circuit 323 includes a third multiplexer 516, and the fourth selection circuit 324 includes a fourth multiplexer 517.

A first input end of the first multiplexer 513 is connected to the first even clock signal, a second input end of the first multiplexer 513 is connected to the first odd clock signal, and an output end of the first multiplexer 513 is configured to output the first mode clock signal.

A first input end of the second multiplexer 515 is connected to the first odd clock signal, a second input end of the second multiplexer 515 is connected to the first even clock signal, and an output end of the second multiplexer 515 is configured to output the second mode clock signal.

A first input end of the third multiplexer 516 is connected to the to-be-processed even chip select signal, a second input end of the third multiplexer 516 is connected to the to-be-processed odd chip select signal, and the output end of the third multiplexer 516 is configured to output the first mode chip select signal.

A first input end of the fourth multiplexer 517 is connected to the to-be-processed odd chip select signal, a second input end of the fourth multiplexer 517 is connected to the to-be-processed even chip select signal, and an output end of the fourth multiplexer 517 is configured to output the second mode chip select signal.

Control ends of the first multiplexer 513, the second multiplexer 515, the third multiplexer 516 and the fourth multiplexer 517 are all connected to the mode selection signal.

In addition, as shown in FIG. 5, the first selection circuit 321 may further include a third buffer 512, a receiving end of the third buffer 512 is configured to receive the first even clock signal, and an output end of the third buffer 512 is connected to the first input end of the first multiplexer 513 and the second input end of the second multiplexer 515. The second selection circuit 322 may further include a fourth buffer 514. A receiving end of the fourth buffer 513 is configured to receive the first odd clock signal, and an output end of the third buffer 513 is connected to the second input end of the first multiplexer 513 and the first input end of the second multiplexer 515. Thus, through the third buffer 512 and the fourth buffer 514, delay and drive enhancement g are implemented in the signal transmission process. In the embodiment of the present disclosure, regardless of the third buffer or the fourth buffer, the number of buffers is not limited to one, and may be multiple. Here, the specific number may be set according to the actual needs, and is not specifically limited.

In some embodiments, based on the signal sampling circuit 30 shown in FIG. 3, as shown in FIG. 4, the first clock processing circuit 33 may include a first logic circuit 331 and a second logic circuit 332, and the second clock processing circuit 34 may include a third logic circuit 341 and a fourth logic circuit 342.

The first logic circuit 331 is configured to receive the first mode clock signal and the first mode chip select signal, and perform sampling and logic operation on the to-be-processed even chip select signal and the first mode chip select signal by using the first mode clock signal, to obtain a first odd chip select clock signal.

The second logic circuit 332 is configured to receive the second mode clock signal and the second mode chip select signal, and perform sampling and logic operation on the to-be-processed odd chip select signal and the second mode chip select signal using the second mode clock signal, to obtain a first even chip select clock signal.

The third logic circuit 341 is configured to receive the first mode clock signal and the first mode chip select signal, and perform sampling and logic operation on the to-be-processed even chip select signal and the first mode chip select signal by using the first mode clock signal, to obtain a second odd chip select clock signal.

The fourth logic circuit 342 is configured to receive the second mode clock signal and the second mode chip select signal for processing, and perform sampling and logic operation on the to-be-processed odd chip select signal and the second mode chip select signal by using the second mode clock signal, to obtain a second even chip select clock signal.

Here, the first chip select clock signal is composed of the first even chip select clock signal and the first odd chip select clock signal, and the second chip select clock signal is composed of the second odd chip select clock signal and the second even chip select clock signal. In FIG. 4 and FIG. 5, the first even chip select clock signal here may be represented by 2T_CLK_E, the first odd chip select clock signal may be represented by 2T_CLK_O, the second even chip select clock signal may be represented by NT_CLK_E, and the second odd chip select clock signal may be represented by NT_CLK_O.

In a specific embodiment, based on the signal sampling circuit 30 shown in FIG. 3, as shown in FIG. 4, the first logic circuit 331 includes a fifth sampling circuit 405, a first NOR gate 520, a first NOT gate 521, a sixth sampling circuit 406, a first OR gate 523 and a first AND gate 524.

The fifth sampling circuit 405 is configured to perform sampling and phase inverting on the to-be-processed even chip select signal by using the first mode clock signal, to obtain a first intermediate odd sampling signal.

The first NOR gate 520 is configured to perform NOR operation on the first intermediate odd sampling signal and the first mode chip select signal, to obtain a second intermediate odd sampling signal.

The first NOT gate 521 is configured to perform NOT operation on the first mode clock signal, to obtain a first inverted odd clock signal.

The sixth sampling circuit 406 is configured to perform sampling on the second intermediate odd sampling signal using the first inverted odd clock signal to obtain a third intermediate odd sampling signal.

The first OR gate 523 is configured to perform OR operation on the second intermediate odd sampling signal and the third intermediate odd sampling signal to obtain a fourth intermediate odd sampling signal.

The first AND gate 524 is configured to perform AND operation on the fourth intermediate odd sampling signal and the first mode clock signal, to obtain a first odd chip select clock signal.

It is to be noted that, as shown in FIG. 5, in the first logic circuit 331, the fifth sampling circuit 405 may be composed of a fifth flip-flop 518 and a third inverter 519, and the sixth sampling circuit 406 may be composed of a sixth flip-flop 522. Herein, both the fifth flip-flop 518 and the sixth flip-flop 522 may be D-type flip-flops. In addition, it is also to be noted that the fifth sampling circuit 405 may be provided without the third inverter 519, and in this case, the subsequent logic operation needs to be adjusted accordingly. For example, the first NOR gate 520 is changed to an OR gate, which can achieve the same effect.

The connection relationship of various devices in the first logic circuit 331 may be understood with reference to FIGS. 4 and 5. In FIG. 4 and FIG. 5, the to-be-processed even chip select signal is represented by PCS_E. The first intermediate odd sampling signal output by the fifth sampling circuit 405 may be represented by PCSB_O. The second intermediate odd sampling signal output by the first NOR gate 520 may be represented by PCS_OEN 1. The third intermediate odd sampling signal output by the sixth sampling circuit 406 may be represented by PCS_OEN 2. The fourth intermediate odd sampling signal output by the first OR gate 523 may be represented by PCS_OEN. The first odd chip select clock signal output by the first AND gate 524 may be represented by 2T_CLK_O.

It is to be noted that, in the first logic circuit 331, the first NOR gate 520 is configured to screen the first chip select signal, output the PCS_OEN 1 signal with a pulse according to the first chip select signal with a first-type pulse shape, and shield the first chip select signals with other pulse shapes as the PCS_OEN 1 signal which is always at a low level, so as to obtain the 2T_CLK_O signal with a pulse subsequently. The fifth sampling circuit 405 is configured to implement first-stage rising edge sampling, while the first NOT gate 521 and the sixth sampling circuit 406 are configured to implement first-stage falling edge sampling. The first-type pulse shape means that the first chip select signal changes to a low level in an even clock cycle and changes to a high level in an adjacent odd clock cycle, at this time, the cycle mode may be a 1N MODE or a 2N MODE. Here, the even clock cycle refers to the clock cycle where the rising edge of the first even clock signal PCLK_E is located, and the odd clock cycle refers to the clock cycle where the rising edge of the first odd clock signal PCLK_O is located.

Thus, for the first chip select signal with the first-type pulse shape, first-stage rising edge sampling, NOR operation and first-stage falling edge sampling are performed on the PCS_E signal to obtain the PCS_OEN 1 signal and the PCS_OEN 2 signal. Both the PCS_OEN 1 signal and the PCS_OEN 2 signal are high active pulse signals, but the rising edge of the PCS_OEN 2 signal is delayed by one preset clock cycle compared with the rising edge of the PCS_OEN 1 signal. Based thereon, through the first OR gate 523, the OR operation on the PCS_OEN 1 signal and the PCS_OEN 2 signal can widen the pulse width, and the pulse width of the obtained PCS_OEN signal is three times the preset clock cycle. Through the first AND gate 524, the PCS_OEN signal and PCLK_2 NE_1 NO signal (PCLK_O signal in the 1N MODE and PCLK_E signal in 2N MODE) are subjected to AND operation, so that the obtained 2T_CLK_O signal has two pulses, each with a pulse width of the preset clock period. Thus, by means of the 2T_CLK_O signal with two pulses, the rising edge of the 2T CMD signal is generated by using the rising edge of the first pulse, and the falling edge of the 2T CMD signal is generated by using the rising edge of the second pulse, so that it can be ensured that the pulse width of the 2T CMD signal is two preset clock cycles within a preset precision range, which can avoid the pulse width of the 2T CMD signal from being affected by the preparation process or environment, thus preventing signal failure.

In a specific embodiment, as shown in FIG. 4, the second logic circuit 332 may include a seventh sampling circuit 407, a second NOR gate 527, a second NOT gate 528, an eighth sampling circuit 408, a second OR gate 530 and a second AND gate 531.

The seventh sampling circuit 407 is configured to perform sampling and phase inverting on the to-be-processed odd chip select signal by using the second mode clock signal, to obtain a first intermediate even sampling signal.

The second NOR gate 527 is configured to perform NOR operation on the first intermediate even sampling signal and the second mode chip select signal, to obtain a second intermediate even sampling signal.

The second NOT gate 528 is configured to perform NOT operation on the second mode clock signal, to obtain a first inverted even clock signal.

The eighth sampling circuit 408 is configured to perform sampling on the second intermediate even sampling signal by using the first inverted even clock signal, to obtain a third intermediate even sampling signal.

The second OR gate 530 is configured to perform OR operation on the second intermediate even sampling signal and the third intermediate even sampling signal to obtain a fourth intermediate even sampling signal.

The second AND gate 531 is configured to perform AND operation on the fourth intermediate even sampling signal and the second mode clock signal, to obtain a first even chip select clock signal.

It is to be noted that, as shown in FIG. 5, in the second logic circuit 332, the seventh sampling circuit 407 may be composed of a seventh flip-flop 525 and a fourth inverter 526, and the eighth sampling circuit 408 may be composed of an eighth flip-flop 529. Herein, both the seventh flip-flop 525 and the eighth flip-flop 529 may be D-type flip-flops. In addition, it is also to be noted that the seventh sampling circuit 407 may be provided without the fourth inverter 526, and in this case, the subsequent logic operation needs to be adjusted accordingly. For example, the second NOR gate 527 is changed to an OR gate, which can achieve the same effect.

The connection relationship of various devices of the second logic circuit 332 may be understood with reference to FIGS. 4 and 5. In FIG. 4 and FIG. 5, the to-be-processed odd chip select signal is represented by PCS_O. The first intermediate even sampling signal output by the seventh sampling circuit 407 may be represented by PCSB_E. The second intermediate even sampling signal output by the second NOR gate 527 may be represented by PCS_EEN 1. The third intermediate even sampling signal output by the eighth sampling circuit 408 may be represented by PCS_EEN 2. The fourth intermediate even sampling signal output by the second OR gate 530 may be represented by PCS_EEN. The first even chip select clock signal output by the second AND gate 531 may be represented by 2T_CLK_E.

It is to be noted that, in the second logic circuit 332, the second NOR gate 527 is configured to screen the first chip select signal, output the PCS_EEN 1 signal with a pulse according to the first chip select signal with a second-type pulse shape, and shield the first chip select signals with other pulse shapes as the PCS_EEN 1 signal which is always at a low level, so as to obtain the 2T_CLK_E signal with a pulse subsequently. The seventh sampling circuit 407 is configured to implement first-stage rising edge sampling, while the second NOT gate 528 and the eighth sampling circuit 408 are configured to implement first-stage falling edge sampling. The second-type pulse shape means that the first chip select signal changes to a low level in an odd clock cycle and changes to a high level in an adjacent even clock cycle, and at this time, the cycle mode may be a 1N MODE or a 2N MODE.

Thus, for the first chip select signal with the second-type pulse shape, first-stage rising edge sampling, NOR operation and first-stage falling edge sampling are performed on the PCS_O signal to obtain the PCS_EEN 1 signal and the PCS_EEN 2 signal. At this time, both the PCS_EEN 1 signal and the PCS_EEN 2 signal are high active pulse signals, and the rising edge of the PCS_EEN 2 signal is delayed by one preset clock cycle compared with the rising edge of the PCS_EEN 1 signal. Based thereon, through the second OR gate 530, the OR operation on the PCS_EEN 1 signal and the PCS_EEN 2 signal can widen the pulse width, and the pulse width of the obtained PCS_EEN signal is three times the preset clock cycle. Through the second AND gate 531, AND operation is performed on the PCS_EEN signal and PCLK_2 NO_1 NE signal (PCLK_E signal in the 1N MODE and PCLK_O signal in the 2N MODE), to obtain 2T_CLK_E signal having two pulses, each with a pulse width of the preset clock period. Thus, by means of the 2T_CLK_E signal with two pulses, the rising edge of the 2T CMD signal is generated by using the rising edge of the first pulse, and the falling edge of the 2T CMD signal is generated by using the rising edge of the second pulse, so that it can be guaranteed that the pulse width of the 2T CMD signal is two preset clock cycles within a preset precision range, which can avoid the pulse width of the 2T CMD signal from being affected by the preparation process or environment, thus preventing signal failure.

That is, in the 1N MODE or the 2N MODE, for the 2T CMD signal, according to the pulse shape of the first chip select signal and the difference of the parity of the corresponding clock cycle when the level state changes, there is at most one valid signal in the 2T_CLK_O signal and the 2T_CLK_E signal, the valid signal has two pulses, each with a pulse width of one preset clock cycle. Thus, the valid signal in the 2T_CLK_O signal and 2T_CLK_E signal is subsequently used as the clock for decoding, so that the decoded target command signal can be distinguished as 2T CMD signal, and meanwhile, the pulse width of the target command signal is guaranteed to be twice the preset clock cycle within the preset precision range.

In another specific embodiment, as shown in FIG. 4, the third logic circuit 341 may include a ninth sampling circuit 409, a third NOT gate 534, a third NOR gate 535, a fourth NOT gate 536, a tenth sampling circuit 410, a third OR gate 538 and a third AND gate 539.

The ninth sampling circuit 409 is configured to perform sampling and phase inverting on the to-be-processed even chip select signal by using the first mode clock signal, to obtain a fifth intermediate odd sampling signal.

The third NOT gate 534 is configured to perform NOT operation on the first mode clock signal, to obtain a first mode inverted chip select signal.

The third NOR gate 535 is configured to perform NOR operation on the fifth intermediate odd sampling signal and the first mode inverted chip select signal, to obtain a sixth intermediate odd sampling signal.

The fourth NOT gate 536 is configured to perform NOT operation on the first mode clock signal, to obtain a first mode inverted clock signal.

The tenth sampling circuit 410 is configured to perform sampling on the sixth intermediate odd sampling signal by using the first mode inverted clock signal, to obtain a seventh intermediate odd sampling signal.

The third OR gate 538 is configured to perform OR operation on the sixth intermediate odd sampling signal and the seventh intermediate odd sampling signal, to obtain an eighth intermediate odd sampling signal.

The third AND gate 539 is configured to perform AND operation on the eighth intermediate odd sampling signal and the first mode clock signal, to obtain a second odd chip select clock signal.

It is to be noted that, as shown in FIG. 5, in the third logic circuit 341, the ninth sampling circuit 409 may be composed of a ninth flip-flop 421 and a fifth inverter 532, and the tenth sampling circuit 410 may be composed of a tenth flip-flop 537. Herein, both the ninth flip-flop 421 and the tenth flip-flop 537 may be D-type flip-flops. In addition, it is also to be noted that the ninth sampling circuit 409 may be provided without the fifth inverter 532, and the subsequent logic operation needs to be adjusted accordingly. For example, the third NOT gate 535 is removed, and the third NOR gate 535 is replaced with an OR gate, which can achieve the same effect.

The connection relationship of various devices of the third logic circuit 341 may be understood with reference to FIGS. 4 and 5. In FIG. 4 and FIG. 5, the to-be-processed even chip select signal is represented by PCS_E. The fifth intermediate odd sampling signal output by the ninth sampling circuit 409 may be represented by PCSB_O. The sixth intermediate odd sampling signal output by the third NOR gate 535 may be represented by NT_PCS_OEN 1. The seventh intermediate odd sampling signal output by the tenth sampling circuit 410 may be represented by NT_PCS_OEN 2. The eighth intermediate odd sampling signal output by the third OR gate 538 may be represented by NT_PCS_OEN. The second odd chip select clock signal output by the third AND gate 539 may be represented by NT_CLK_O.

It is to be noted that, in the third logic circuit 341, the third NOT gate 534 and the third NOR gate 535 are configured to screen the first chip select signal, output the NT_PCS_OEN 1 signal with a pulse according to the first chip select signal with a third-type pulse shape, and shield the first chip select signals with other pulse shapes as the NT_PCS_OEN 1 signal which is always at a low level, so as to obtain the NT_CLK_O signal with a pulse subsequently. The ninth sampling circuit 409 is configured to implement first-stage rising edge sampling, while the fourth NOT gate 536 and the tenth sampling circuit 410 are configured to implement first-stage falling edge sampling. The third-type pulse shape means that in the 1N MODE, the first chip select signal is changed to a low level in the even clock cycle and remains at a low level in the adjacent odd clock cycle; or in the 2N MODE, the first chip select signal is changed to a low level in two adjacent even clock cycles and is changed to a high level in a middle odd clock cycle.

Thus, for the first chip select signal with the third-type pulse shape, the PCS_E signal is subjected to first-stage rising edge sampling, NOT operation, NOR operation and first-stage falling edge sampling, to obtain a NT_PCS_OEN 1 signal and the NT_PCS_OEN 2 signal. At this time, both the NT_PCS_OEN 1 signal and the NT_PCS_OEN 2 signal are high active pulse signals, and the rising edge of the NT_PCS_OEN 2 signal is delayed by one preset clock cycle compared with the rising edge of the NT_PCS_OEN 1 signal. Based thereon, the OR operation on the NT_PCS_OEN 1 signal and the NT_PCS_OEN 2 signal can widen the pulse width, and the pulse width of the obtained NT_PCS_OEN signal is three times the preset clock cycle. Then, AND operation is performed on the NT_PCS_OEN signal and the PCLK_2 NE_1 NO signal (PCLK_O signal in the 1N MODE and PCLK_E signal in the 2N MODE), to obtain NT_CLK_O signal having two pulses, each with a the pulse width of the preset clock period. Thus, by means of the NT_CLK_O signal with two pulses, the rising edge of the NT ODT CMD signal is generated using the rising edge of the first pulse, and the falling edge of the NT ODT CMD signal is generated using the rising edge of the second pulse, so that it can be guaranteed that the pulse width clock of the NT ODT CMD signal is two preset clock cycles within a preset precision range, which can avoid the pulse width of the NT ODT CMD signal from being affected by the preparation process or environment, thus preventing signal failure.

In another specific embodiment, as shown in FIG. 4, the fourth logic circuit 342 may include an eleventh sampling circuit 411, a fifth NOT gate 542, a fourth NOR gate 543, a sixth NOT gate 544, a twelfth sampling circuit 412, a fourth OR gate 546 and a fourth AND gate 547.

The eleventh sampling circuit 411 is configured to perform sampling and phase inverting on the to-be-processed odd chip select signal by using the second mode clock signal, to obtain a fifth intermediate even sampling signal.

The fifth NOT gate 542 is configured to perform NOT operation on the second mode chip select signal, to obtain a second mode inverted chip select signal.

The fourth NOR gate 543 is configured to perform NOR operation on the fifth intermediate even sampling signal and the second mode inverted chip select signal, to obtain a sixth intermediate even sampling signal.

The sixth NOT gate 544 is configured to perform NOT operation on the second mode clock signal, to obtain a second mode inverted clock signal.

The twelfth sampling circuit 412 is configured to perform sampling on the sixth intermediate even sampling signal by using the second mode inverted clock signal, to obtain a seventh intermediate even sampling signal.

The fourth OR gate 546 is configured to perform OR operation on the sixth intermediate even sampling signal and the seventh intermediate even sampling signal, to obtain an eighth intermediate even sampling signal.

The fourth AND gate 547 is configured to perform AND operation on the eighth intermediate even sampling signal and the second mode clock signal, to obtain a second even chip select clock signal.

It is to be noted that, as shown in FIG. 5, in the fourth logic circuit 342, the eleventh sampling circuit 411 may be composed of an eleventh flip-flop 540 and a sixth inverter 541, and the twelfth sampling circuit 412 may be composed of a twelfth flip-flop 545. Herein, both the eleventh flip-flop 540 and the twelfth flip-flop 545 may be D-type flip-flops. In addition, it is also to be noted that the eleventh sampling circuit 411 may be provide without the sixth inverter 541, and the subsequent logic operation needs to be adjusted accordingly. For example, the fifth NOT gate 542 is removed, and the fourth NOR gate 543 is replaced with an OR gate, which can achieve the same effect.

The connection relationship of various devices of the fourth logic circuit 342 may be understood with reference to FIGS. 4 and 5. In FIG. 4 and FIG. 5, the to-be-processed odd chip select signal is represented by PCS_O. The fifth intermediate even sampling signal output by the eleventh sampling circuit 411 may be represented by PCSB_E. The sixth intermediate even sampling signal output by the fourth NOR gate 543 may be represented by NT_PCS_EEN 1. The seventh intermediate even sampling signal output by the twelfth sampling circuit 412 may be represented by NT_PCS_EEN 2. The eighth intermediate even sampling signal output by the fourth OR gate 546 may be represented by NT_PCS_EEN. The second even chip select clock signal output by the fourth AND gate 547 may be represented by NT_CLK_E.

It is to be noted that, in the fourth logic circuit 342, the fifth NOT gate 542 and the fourth NOR gate 543 are configured to screen the first chip select signal, output the NT_PCS_EEN 1 signal with a pulse according to the first chip select signal with a fourth-type pulse shape, and shield the first chip select signals with other pulse shapes as the NT_PCS_EEN 1 signal which is always at a low level, so as to obtain the NT_CLK_E signal with a pulse subsequently. The eleventh sampling circuit 411 is configured to implement a first-stage rising edge sampling circuit, and the sixth NOT gate 544 and the twelfth sampling circuit 412 are configured to implement a first-stage falling edge sampling circuit. The fourth-type pulse shape means that in the 1N MODE, the first chip select signal is changed to a low level in the odd clock cycle and remains at the low level in the adjacent even clock cycle, or in the 2N MODE, the first chip select signal is changed to a low level in two adjacent odd clock cycles and is changed to a high level in a middle even clock cycle.

Thus, for the first chip select signal with the fourth-type pulse shape, the PCS_O signal is processed by the first-stage rising edge sampling circuit, a NOT operation circuit, a NOR operation circuit and a first-stage falling edge sampling circuit to obtain the NT_PCS_EEN 1 signal and the NT_PCS_EEN 2 signal. At this time, both the NT_PCS_EEN 1 signal and the NT_PCS_EEN 2 signal are high active pulse signals, and the rising edge of the NT_PCS_EEN 2 signal is delayed by one preset clock cycle compared with the rising edge of the NT_PCS_EEN 1 signal. Based thereon, through the fourth OR gate 546, the OR operation on the NT_PCS_EEN 1 signal and the NT_PCS_EEN 2 signal can widen the pulse width, and the pulse width of the obtained NT_PCS_EEN signal is three times the preset clock cycle. Through the fourth AND gate 547, AND operation is performed on the NT_PCS_EEN signal and PCLK_2 NO_1 NE signal (PCLK_E signal in the 1N MODE and PCLK_O signal in the 2N MODE), to obtain NT_CLK_O signal having two pulses, each with a pulse width of the preset clock period. Thus, by means of the NT_CLK_E signal with two pulses, the rising edge of the NT ODT CMD signal is generated by using the rising edge of the first pulse, and the falling edge of the NT ODT CMD signal is generated by using the rising edge of the second pulse, so that it can be guaranteed that the pulse width of the NT ODT CMD signal is two preset clock cycles within a preset precision range, which can avoid the pulse width of the NT ODT CMD signal from being affected by the preparation process or environment, thus preventing signal failure.

That is, in the 1N MODE or the 2N MODE, for the NT ODT CMD signal, according to the pulse shape of the first chip select signal and the difference of the parity of the corresponding clock cycle when the level state changes, there is at most one valid signal in the NT_CLK_O signal and the NT_CLK_E signal, the valid signal has two pulses, each with a pulse width of one preset clock cycle. Thus, the valid signal in the NT_CLK_O signal and NT_CLK_E signal is subsequently used as the clock for decoding, so that the decoded target command signal can be distinguished as NT ODT CMD signal, and meanwhile, it is guaranteed that the pulse width of the target command signal is twice the preset clock cycle. Thus, through the above circuit, the target command signal decoded in different cycle modes can be distinguished as a NT ODT CMD signal or a 2T CMD signal, and meanwhile, it is guaranteed that the pulse width of the target command signal is two preset clock cycles within the preset precision range.

In some embodiments, based on the signal sampling circuit 30 shown in FIG. 3, as shown in FIG. 4, the command decoding circuit 35 may include a first command decoding circuit 351 and a second command decoding circuit 352.

The first command decoding circuit 351 is configured to receive the first chip select clock signal, and perform decoding and sampling on the to-be-processed command signal according to the first chip select clock signal and the to-be-processed chip select signal, to obtain a first target command signal.

The second command decoding circuit 352 is configured to receive the second chip select clock signal, and perform decoding and sampling on the to-be-processed command signal according to the second chip select clock signal and the to-be-processed chip select signal, to obtain a second target command signal.

It is to be understood that, in some embodiments, the initial chip select signal is a signal that indicates that a target chip is selected, and the initial chip select signal is a low active pulse signal.

If the initial chip select signal includes a pulse with a pulse width of a preset clock cycle, the first chip select clock signal is determined as a valid signal, and the first target command signal output by the first command decoding circuit is determined as a target command signal.

If the initial chip select signal includes a pulse with a pulse width that is twice the preset clock period, or the initial chip select signal includes two pulses, each with a pulse width of the preset clock period, the second chip select clock signal is determined as a valid signal, and the second target command signal output by the second command decoding circuit is determined as a target command signal.

It is to be noted that the first target command signal may be represented by a 2T CMD signal, and the second target command signal may be represented by an NT ODT CMD signal. Thus, regardless of in the 1N MODE or in the 2N MODE, the 2T CMD signal is output through the first command decoding circuit, and the NT ODT CMD signal is output through the second command decoding circuit, which can avoid confusion and distinguish different types of command signals.

In a specific embodiment, for the first command decoding circuit 351, based on the signal sampling circuit 30 shown in FIG. 3, as shown in FIG. 4 or FIG. 5, the first command decoding circuit 351 may include a first decoding and sampling circuit 421 and a fifth OR gate 548.

The first decoding and sampling circuit 421 is configured to perform decoding and sampling on the to-be-processed even command signal according to the first odd chip select clock signal and the to-be-processed even chip select signal, to obtain a first even command signal; and perform decoding and sampling on the to-be-processed odd command signal according to the first even chip select clock signal and the to-be-processed odd chip select signal, to obtain a first odd command signal.

The fifth OR gate 548 is configured to perform OR operation on the first even command signal and the first odd command signal, to obtain a first target command signal.

The second command decoding circuit 352 includes a second decoding and sampling circuit 422 and a sixth OR gate 549.

The second decoding and sampling circuit 422 is configured to perform decoding and sampling on the to-be-processed even command signal according to the second odd chip select clock signal and the to-be-processed even chip select signal, to obtain a second even command signal; and perform decoding and sampling on the to-be-processed odd command signal according to the second even chip select clock signal and the to-be-processed odd chip select signal to obtain a second odd command signal.

The sixth OR gate 549 is configured to perform OR operation on the second even command signal and the second odd command signal, to obtain a second target command signal.

It is to be noted that, as shown in FIG. 4 or FIG. 5, in the embodiment of the present disclosure, the first decoding and sampling circuit 421 here may also be referred to as a first command decoding flip-flop, which is represented by CMD DEC DFF 1. The output of the first decoding and sampling circuit 421 includes a first even command signal and a first odd command signal. Herein, the first even command signal is represented by 2T_CMD_E, and the first odd command signal is represented by 2T_CMD_O. Then, the first target command signal obtained by performing OR operation on the 2T_CMD_E signal and the 2T_CMD_O signal is represented by 2T CMD.

The second decoding and sampling circuit 422 here may also be referred to as a second command decoding flip-flop, which is represented by CMD DEC DFF 2. The output of the second decoding and sampling circuit includes a second even command signal and a second odd command signal. Herein, the second even command signal is represented by NT_CMD_E, and the second odd command signal is represented by NT_CMD_O. Then, the second target command signal obtained by performing OR operation on the NT_CMD_E signal and the NT_CMD_O signal is represented by NT ODT CMD.

Figure 6A:
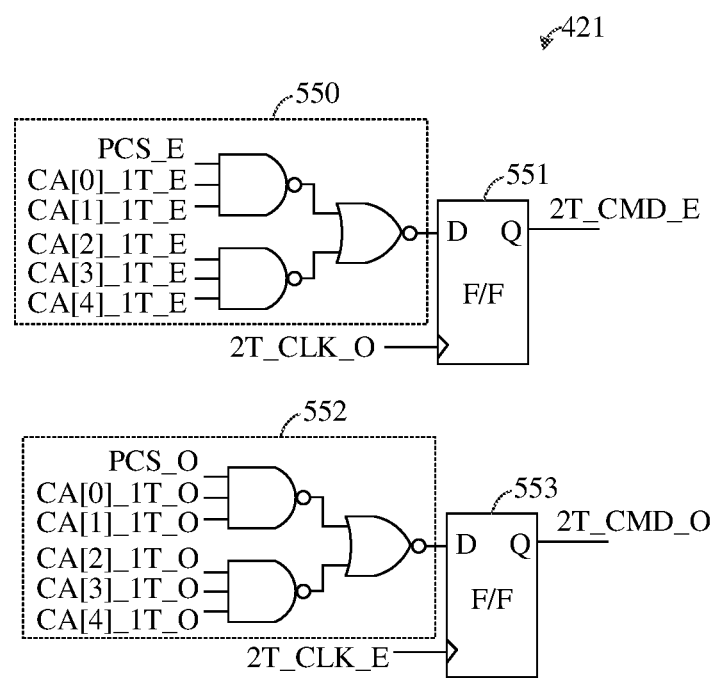
FIG. 6A is a composition structure diagram of a first decoding and sampling circuit according to an embodiment of the present disclosure.

Further, based on the signal sampling circuit 30 shown in FIGS. 4 and 5, as shown in FIG. 6A, the first decoding and sampling circuit 421 includes a first decoding circuit 550, a thirteenth sampling circuit 551, a second decoding circuit 552 and a fourteenth sampling circuit 553.

The first decoding circuit 550 is configured to perform decoding on the to-be-processed even chip select signal and the to-be-processed even command signal to obtain a first even decoding signal.

The thirteenth sampling circuit 551 is configured to perform sampling on the first even decoding signal by using the first odd chip select clock signal, to obtain a first even command signal.

The second decoding circuit 552 is configured to perform decoding on the to-be-processed odd chip select signal and the to-be-processed odd command signal, to obtain a first odd decoding signal.

The fourteenth sampling circuit 553 is configured to perform sampling on the first odd decoding signal by using the first even chip select clock signal, to obtain a first odd command signal.

It is to be noted that, in FIG. 6A, the to-be-processed even command signal may include five signals such as CA [0]_1T_E, CA [1]_1T_E, CA [2]_1T_E, CA [3]_1T_E, and CA [4]_1T_E, and the first decoding circuit 550 may be composed of a three-input NAND gate, a three-input NAND gate and a two-input NOR gate. Herein, PCS_E, CA [0]_1T_E and CA [1]_1T_E are input to the first three-input NAND gate, and CA [2]_1T_E, CA [3]_1T_E and CA [4]_1T_E are input to the second three-input NAND gate. Then, an output end of the first three-input NAND gate is connected to an input end of the two-input NOR gate, an output end of the second three-input NOR gate is connected to the other input end of the two-input NOR gate, and an output end of the two-input NOR gate is configured to output a first even decoding signal, thus implementing decoding on the to-be-processed even chip select signal and the to-be-processed even command signal. After the first even decoding signal is obtained, sampling output is performed by using a thirteenth sampling circuit 551. Specifically, the thirteenth sampling circuit 551 may be a D-type flip-flop, a clock end of the D-type flip-flop is connected to the 2T_CLK_O signal, an input end of the D-type flip-flop is connected to an output end of the two-input NOR gate, and the output end of the D-type flip-flop is configured to output the 2T_CMD_E signal.

It is also to be noted that in FIG. 6A, the to-be-processed odd command signal may include five signals such as CA [0]_1T_O, CA [1]_1T_O, CA [2]_1T_O, CA [3]_1T_O and CA [4]_1T_O, and the second decoding circuit 552 may be composed of two three-input NAND gates and a two-input NOR gate. Herein, PCS_O, CA [0]_1T_O and CA [1]_1T_O are input to the first three-input NAND gate, and CA [2]_1T_O, CA [3]_1T_O and CA [4]_1T_O are input to the second three-input NAND gate. Then, an output end of the first three-input NAND gate is connected to an input end of the two-input NOR gate, an output end of the second three-input NOR gate is connected to the other input end of the two-input NOR gate, and an output end of the two-input NOR gate is configured to output a first odd decoding signal, thus implementing decoding on the to-be-processed even chip select signal and the to-be-processed even command signal. After the first odd decoding signal is obtained, sampling output is performed by using a fourteenth sampling circuit 553. Specifically, the fourteenth sampling circuit 553 may also be a D-type flip-flop, a clock end of the D-type flip-flop is connected to the 2T_CLK_E signal, an input end of the D-type flip-flop is connected to an output end of the two-input NOR gate, and the output end of the D-type flip-flop is configured to output the 2T_CMD_O signal.

Figure 6B:
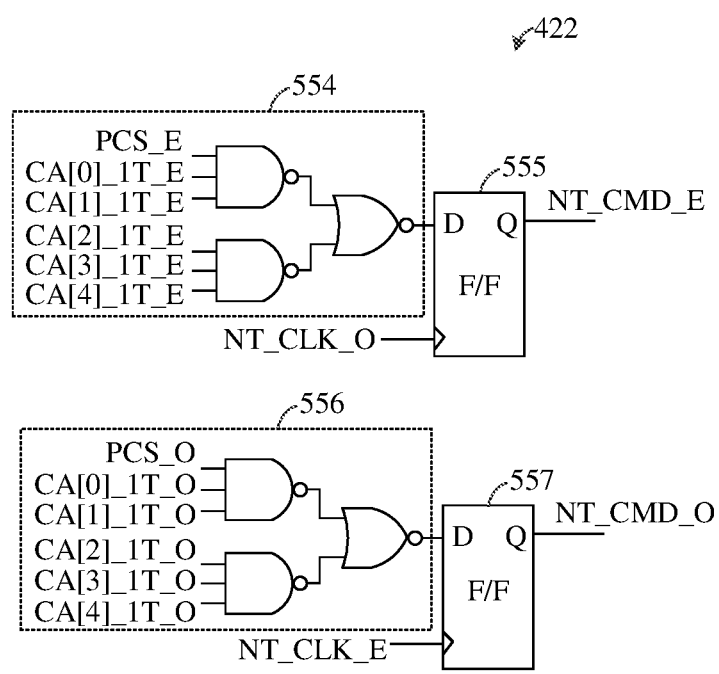
FIG. 6B is a composition structure diagram of a second decoding and sampling circuit according to an embodiment of the present disclosure.

It is also to be noted that in the embodiment of the present disclosure, as shown in FIG. 6B, the second decoding and sampling circuit 422 includes a third decoding circuit 554, a fifteenth sampling circuit 555, a fourth decoding circuit 556 and a sixteenth sampling circuit 557.

The third decoding circuit 554 is configured to perform decoding on the to-be-processed even chip select signal and the to-be-processed even command signal, to obtain a second even decoding signal.

The fifteenth sampling circuit 555 is configured to perform sampling on the second even decoding signal according to the second odd chip select clock signal to obtain a second even command signal.

The fourth decoding circuit 556 is configured to perform decoding on the to-be-processed odd chip select signal and the to-be-processed odd command signal to obtain a second odd decoding signal.

The sixteenth sampling circuit 557 is configured to perform sampling on the second odd decoding signal by using the second even chip select clock signal, to obtain a second odd command signal.

It is to be noted that, in FIG. 6B, the circuit structure of the second decoding and sampling circuit 422 is the same as the circuit structure of the first decoding and sampling circuit 421, except for the signals received at some of signal ends which are different, and therefore the second decoding and sampling circuit 422 may be understood by referring to the first decoding and sampling circuit 421.

In addition, it is to be noted that regardless of the first decoding circuit 550, the second decoding circuit 552, the third decoding circuit 554 or the fourth decoding circuit 556, the design of these decoding circuits is specifically implemented according to a command decoding rule. For different products, different application scenarios, and different commands, the decoding rules may be different, and then the logic of the decoding circuit may also be adjusted accordingly, which is not specifically limited in the embodiments of the disclosure.

Thus, by adding the mode selection circuit 32, the first clock processing circuit 33 and the second clock processing circuit 34, different first chip select clock signals (represented by 2T_CLK_E/2T_CLK_O) and different second chip select clock signals (represented by NT_CLK_E/NT_CLK_O) may be output according to different cycle modes and the pulse shapes of the first chip select signal. Thus, when the initial chip select signal includes a pulse with the pulse width of the preset clock cycle (corresponding to the 2T CMD signal in the 1N MODE or the 2T CMD signal in the 2N MODE), the first target command signal obtained by the first command decoding circuit 351 using the 2T_CLK_E/2T_CLK_O signal is a valid signal (namely, a high active pulse signal), and the second target command signal obtained by the second command decoding circuit 352 using the 2T_CLK_E/2T_CLK_O signal is an invalid signal (namely, a low-level signal). On the contrary, when the initial chip select signal includes a pulse with a pulse width that is twice the preset clock cycle (corresponding to the NT ODT CMD signal in the 1N MODE) or the initial chip select signal includes two pulses, each with a pulse width of the preset clock cycle (corresponding to the NT ODT CMD signal in the 2N MODE), the first target command signal obtained by the first command decoding circuit 351 using the NT_CLK_E/NT_CLK_O signal is an invalid signal (namely, a low-level signal), and the second target command signal obtained by the second command decoding circuit 352 using the NT_CLK_E/NT_CLK_O signal is a valid signal (namely, a high active pulse signal). Therefore, the two signals 2T CMD and NT ODT CMD can be correctly distinguished and decoded accurately.

In other words, according to the cycle modes and the pulse shapes of the initial chip select signal, the signal processing process of the signal sampling circuit may be classified into three cases.

Case 1: when the target mode is a 1N MODE or a 2N MODE, and the initial chip select signal includes a pulse with a pulse width of the preset clock cycle, it is determined that the first chip select clock signal includes two pulses, each with a pulse width of the preset clock cycle. The rising edge of a first pulse in the first chip select clock signal is configured to generate a rising edge of the first target command signal, and the rising edge of a second pulse in the first chip select clock signal is configured to generate a falling edge of the first target command signal; and it is determined that the second chip select clock signal maintains the level state and the second target command signal maintains the level state.

Case 2: when the target mode is the 1N MODE, and the initial chip select signal includes a pulse with a pulse width that is twice the preset clock cycle, it is determined that the first chip select clock signal maintains the level state, and the first target command signal maintains the level state; and it is determined that the second chip select clock signal includes two pulses, each with a pulse width of the preset clock cycle, the rising edge of a first pulse in the second chip select clock signal is configured to generate a rising edge of the second target command signal, and the rising edge of a second pulse in the second chip select clock signal is configured to generate a falling edge of the second target command signal.

Case 3: when the target mode is the 2N MODE, and the initial chip select signal includes two pulses, each with a pulse width of the preset clock cycle, it is determined that the first target command signal maintains the level state, the second chip select clock signal includes two pulses, each with a pulse width of the preset clock cycle, the rising edge of the first pulse in the second chip select clock signal is configured to generate a rising edge of the second target command signal, and the rising edge of the second pulse in the second chip select clock signal is configured to generate a falling edge of the second target command signal.

In a specific embodiment, the case 1 may be further classified into two specific cases for explanation, i.e., the case where the target mode is the 1N MODE or 2N MODE, and the initial chip select signal includes a pulse with a pulse width of the preset clock cycle.

If the first chip select signal is at a low level when sampled at the rising edge of an even clock cycle and is at a high level when sampled at the rising edge of a next adjacent odd clock cycle, it is determined that the first odd chip select clock signal is a valid signal, and the first odd chip select clock signal has two pulses. Herein, the rising edge of the first pulse in the first odd chip select clock signal is configured to generate the rising edge of the first target command signal, and the rising edge of the second pulse in the first odd chip select clock signal is configured to generate the falling edge of the first target command signal.

If the first chip select signal is at a low level when sampled at the rising edge of an odd clock cycle and is at a high level when sampled at the rising edge of a next adjacent even clock cycle, it is determined that the first even chip select clock signal is a valid signal, and the first even chip select clock signal has two pulses. Herein, the rising edge of the first pulse in the first even chip select clock signal is configured to generate the rising edge of the first target command signal, and the rising edge of the second pulse in the first even chip select clock signal is configured to generate the falling edge of the first target command signal.

In a specific embodiment, the case 2 may be further classified into two specific cases for explanation, i.e., the case where the target mode is the 1N MODE, and the initial chip select signal includes a pulse with a pulse width that is twice the preset clock cycle.

If the first chip select signal is at a low level when sampled at the rising edge of an even clock cycle and is still at the low level when sampled at the rising edge of a next adjacent odd clock cycle, it is determined that the second odd chip select clock signal is a valid signal, and the second odd chip select clock signal has two pulses. Herein, the rising edge of the first pulse in the second odd chip select clock signal is configured to generate the rising edge of the second target command signal, and the rising edge of the second pulse in the second odd chip select clock signal is configured to generate the falling edge of the second target command signal.

If the first chip select signal is at a low level when sampled at the rising edge of an odd clock cycle and is still at the low level when sampled at the rising edge of a next adjacent even clock cycle, it is determined that the second even chip select clock signal is a valid signal, and the second even chip select clock signal has two pulses. Herein, the rising edge of the first pulse in the second even chip select clock signal is configured to generate the rising edge of the second target command signal, and the rising edge of the second pulse in the second even chip select clock signal is configured to generate the falling edge of the second target command signal.

In a specific embodiment, the case 3 is further classified into two specific cases for explanation, i.e., the case where the target mode is the 2N MODE, and the initial chip select signal includes two pulses, each with a pulse width of the preset clock cycle.

If the first chip select signal is at a low level when sampled at the rising edges of two consecutive even clock cycles and is at a high level when sampled at the rising edge of an odd clock cycle between the two consecutive even clock cycles, it is determined that the second odd chip select clock signal is a valid signal, and the second odd chip select clock signal has two pulses. The rising edge of the first pulse in the second odd chip select clock signal is configured to generate the rising edge of the second target command signal, and the rising edge of the second pulse in the second odd chip select clock signal is configured to generate the falling edge of the second target command signal.

If the first chip select signal is at a low level when sampled at the rising edge of two consecutive odd clock cycles and is at a high level when sampled at the rising edge of an even clock cycle between the two consecutive odd clock cycles, it is determined that the second even chip select clock signal is a valid signal, and the second even chip select clock signal has two pulses. Herein, the rising edge of the first pulse in the second even chip select clock signal is configured to generate the rising edge of the second target command signal, and the rising edge of the second pulse in the second even chip select clock signal is configured to generate the falling edge of the second target command signal.

The embodiments of the present disclosure provide a signal sampling circuit. On the one hand, regardless of in a 1N MODE or in a 2N MODE, both a 2T CMD signal and an NT ODT CMD signal can be subjected to sampling and decoding processing by the aforementioned signal sampling circuit, and the 2T CMD signal and the NT ODT CMD signal can be clearly distinguished without the need of separately providing a decoding circuit for the 2N MODE, thus not only saving circuit area but also reducing power consumption. On the other hand, according to a valid signal in the first chip select clock signal and the second chip select clock signal, a target command signal is output through a corresponding command decoding circuit, so that the two commands 2T CMD and NT ODT CMD can be distinguished and decoded accurately without affecting each other. On another hand, since both the valid signals in the first chip select clock signal and the second chip select clock signal include two pulses, each with a pulse width of a preset clock cycle, and the rising edge of the first pulse is configured to generate the rising edge of the target command signal, and the rising edge of the second pulse is configured to generate the falling edge of the target command signal, so that the pulse width of the finally output target command signal may be twice the preset clock cycle within a preset precision range, and the problem of uncertain pulse width of the target command signal can be avoided.

In another embodiment of the present disclosure, continuously referring to FIG. 5, the signal sampling circuit 30 may include a first receiver 501, a second receiver 502, a third receiver 503, a first flip-flop 504, a first buffer 505, a second flip-flop 506, a second buffer 507, a third flip-flop 508, a first inverter 509, a fourth flip-flop 510, a second inverter 511, a third buffer 512, a first multiplexer 513, a fourth buffer 514, a second multiplexer 515, a third multiplexer 516, a fourth multiplexer 517, a fifth flip-flop 518, a third inverter 519, a first NOR gate 520, a first NOT gate 521, a sixth flip-flop 522, a first OR gate 523, a first AND gate 524, a seventh flip-flop 525, a fourth inverter 526, a second NOR gate 527, a second NOT gate 528, an eighth flip-flop 529, a second OR gate 530, a second AND gate 531, a ninth flip-flop 532, a fifth inverter 533, a third NOT gate 534, a third NOR gate 535, a fourth NOT gate 536, a tenth flip-flop 537, a third NOR gate 538, a third AND gate 539, an eleventh flip-flop 540, a sixth inverter 541, a fifth NOT gate 542, a fourth NOR gate 543, a sixth NOT gate 544, a twelfth flip-flop 545, a fourth OR gate 546, a fourth AND gate 547, a first command decoding flip-flop 421, a fifth OR gate 548, a second command decoding flip-flop 422 and a sixth OR gate 549. Herein, the first flip-flop 504, the second flip-flop 506, the third flip-flop 508, the first inverter 509, the fourth flip-flop 510, the fifth flip-flop 518, the sixth flip-flop 522, the seventh flip-flop 525, the eighth flip-flop 529, the ninth flip-flop 532, the tenth flip-flop 537, the eleventh flip-flop 540 and the twelfth flip-flop 545 may all be D-type flip-flops. In addition, the specific structure of the first command decoding flip-flop 421 is shown in FIG. 6A, and the specific structure of the second command decoding flip-flop 422 is shown in FIG. 6B.

It is to be noted that the circuit principle of FIG. 5 may be referred to the above, and will not be described in detail here. Based on the signal sampling circuit 30 shown in FIG. 5, the corresponding signal timing sequence diagram is shown in FIGS. 7 to 10. The first command address signal is represented by CA, and CA may include Cy, Cz, C0, C1, C2 and C3. The initial chip select signal is represented by CS_n, and is configured to characterize a signal that a target chip is selected. The first chip select signal is represented by PCS, the PCS signal is a low active pulse signal, and PCS is configured to characterize a signal that the target chip is selected. The initial clock signal is represented by CK_t, the first even clock signal is represented by PCLK_E, and the first odd clock signal is represented by PCLK_O. Moreover, the clock period of the CK_t signal is the preset clock period, and both the clock periods of the PCLK_E signal and the PCLK_O signal are twice the preset clock period. The signal timing sequence of the signal sampling circuit 30 is described below in view of four scenarios.

Figure 7:
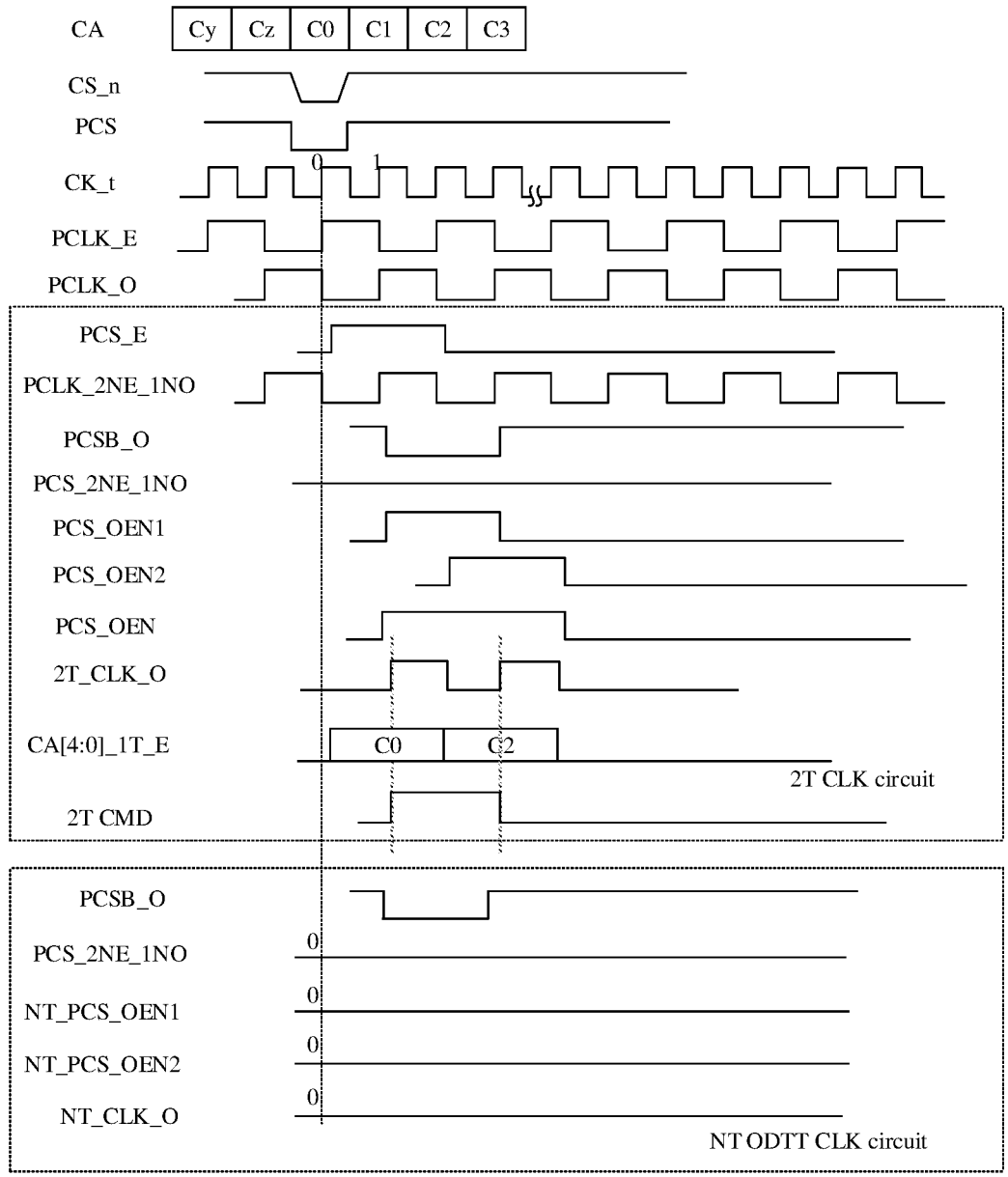
FIG. 7 is a schematic diagram of a signal timing sequence of a signal sampling circuit according to an embodiment of the present disclosure.

Scenario 1: as shown in FIG. 7, it is assumed that it is in the 1N MODE and the first chip select signal is at a low level when sampled at the rising edge of an even clock cycle and at a high level when sampled at the rising edge of a next adjacent odd clock cycle.

At the time, as shown in FIG. 7, the CA signal is sampled by using a PCLK_E signal to obtain a CA [4:0]_1T_E signal, which includes C0 and C2. The PCS signal is sampled and inverted by using the PCLK_E signal to obtain a PCS_E signal, which is a high active pulse signal, with a pulse width that is twice the preset clock period. The PCS signal is sampled and inverted by using the PCLK_O signal to obtain PCS_O (not shown in FIG. 7, but waveform thereof may refer to PCS_2NE_1NO), which is always a low-level signal.

In the 2T CLK circuit, the PCSK_E signal is sampled and inverted by using the PCLK_2NE_1NO signal (actually the PCLK_O signal) to obtain a PCSB_O signal, which is a low active pulse signal, with a pulse width that is twice the preset clock cycle, but is delayed by a preset clock cycle compared with the PCSK_E signal. The PCSB_O signal and the PCS_2NE_1NO signal (essentially the PCS_O signal) are subjected to NOR operation to obtain a PCS_OEN1 signal, which is a high active pulse signal, with a pulse width that is twice the preset clock period. The PCS_OEN1 signal is sampled by the falling edge of the PCLK_2NE_1NO signal (essentially the PCLK_O signal) to obtain a PCS_OEN2 signal, which is also a high active pulse signal, with a pulse width that is twice the preset clock cycle, but is delayed by a preset clock cycle compared with the PCS_OEN1 signal. Thus, the PCS_OEN1 signal and the PCS_OEN2 signal are subjected to OR operation to obtain a PCS_OEN signal, with a pulse width of three times the preset clock period. That is, the first OR gate 523 plays a role in widening the pulse width. The PCS_OEN signal with the PCLK_2NE_1NO signal (essentially the PCLK_O signal) is subjected to AND logic to obtain a 2T_CLK_O signal, which includes two pulses, with a pulse width of the preset clock period. Meanwhile, in the scenario, the 2T_CLK_E signal (not shown in FIG. 7) is an invalid signal always at a low level. Therefore, through the first command decoding flip-flop 421, the CA[4:0]_1T_E signal is decoded and sampled using the 2T_CLK_O signal to obtain a 2T CMD signal. The 2T CMD is a high active pulse signal, with a pulse width of twice the preset clock period. Herein, the rising edge of a first pulse in the 2T_CLK_O signal is configured to generate a rising edge of the 2T CMD signal, and the rising edge of a second pulse in the 2T_CLK_O signal is configured to generate a falling edge of the 2T CMD signal. Particularly, the PCLK_2NE_1NO signal is essentially the PCLK_O signal, which means that: the PCLK_2NE_1NO signal comes from the PCLK_O signal, and the waveform of the PCLK_2NE_1NO signal is consistent with the waveform of the PCLK_O signal, but the PCLK_2NE_1NO signal may have a slight time delay (the time delay is not shown in the figure) compared with the PCLK_O signal. The word "essence" in the embodiment of the disclosure may be correspondingly understood with reference to the explanation.

In the NT ODT CLK circuit, the PCS_E signal is sampled and inverted by using the PCLK_2NE_1NO signal (essentially the PCLK_O signal) to obtain the PCSB_O signal, which is a low active pulse signal, with a pulse width that is twice the preset clock cycle. Since the inverted signal of PCS_2NE_1NO (essentially the PCS_O signal) is always a high-level signal, the NT_PCS_OEN1 signal, which is always a low-level signal, can be obtained by performing NOR operation on the PCSB_O signal and the inverted signal of PCS_2NE_1NO (essentially the PCS_O signal), and then NT_PCS_OEN2 is always a low-level signal as well. Therefore, the NT_CLK_O signal is an invalid signal always at a low level. Meanwhile, the NT_CLK_E signal in the case is also an invalid signal always at a low level. Therefore, neither the NT_CLK_O signal nor the NT_CLK_E signal will lead to valid decoding and sampling, and the NT ODT CMD signal cannot be obtained.

In brief, in the 1N MODE, as shown in FIG. 7, for the 2T CMD signal, the CS_n signal is at a low level only in one preset clock cycle, becomes the PCS_E signal after being sampled by using the PCLK_E signal and then becomes the PCSB_O signal after being sampled by PCLK_2NE_1NO (PCLK_O in the 1N MODE). Herein, the PCSB_O signal and the PCS_2NE_1NO (PCS_O in the 1N MODE) are subjected to NOR logic and then sampled to generate PCS_OEN1/2 to cover the 2T_CLK_O signal. Finally, the 2T_CLK_O signal is used to sample the CA[4:0]_1T_E signal and the PCS_E signal to output the 2T CMD signal.

In another branch circuit, the inverted signal of the PCSB_O/E signal and the inverted signal of the PCS_2NE_1NO/PCS_2NO_1NE signal are subjected to NOR logic, which leads to both the NT_PCS_OEN1/2 signal and the NT_PCS_EEN1/2 signal being low level, without covering clock sampling, so the NT ODT CMD signal is not output.

Similarly, if the first chip select signal is at a low level when sampled at the rising edge of an odd clock cycle and at a high level when sampled at the rising edge of the next adjacent even clock cycle, at the time, the 2T_CLK_E signal includes two pulses, each with a pulse width of the preset clock cycle, but the 2T_CLK_O signal is an invalid signal which is always at a low level. Thus, through the first command decoding flip-flop 421, the CA[4:0]_1T_O signal is subjected to decoding and sampling according to the 2T_CLK_E signal to obtain the 2T CMD signal. Herein, the rising edge of the first pulse in the 2T_CLK_E signal is configured to generate the rising edge of the 2T CMD signal, and the rising edge of the second pulse in the 2T_CLK_E signal is configured to generate the falling edge of the 2T CMD signal. In addition, since both the NT_CLK_O signal and the NT_CLK_E signal are invalid signals at a low level, neither the NT_CLK_O signal nor the NT_CLK_E signal will lead to valid decoding and sampling, and the NT ODT CMD signal cannot be obtained.

Figure 8:
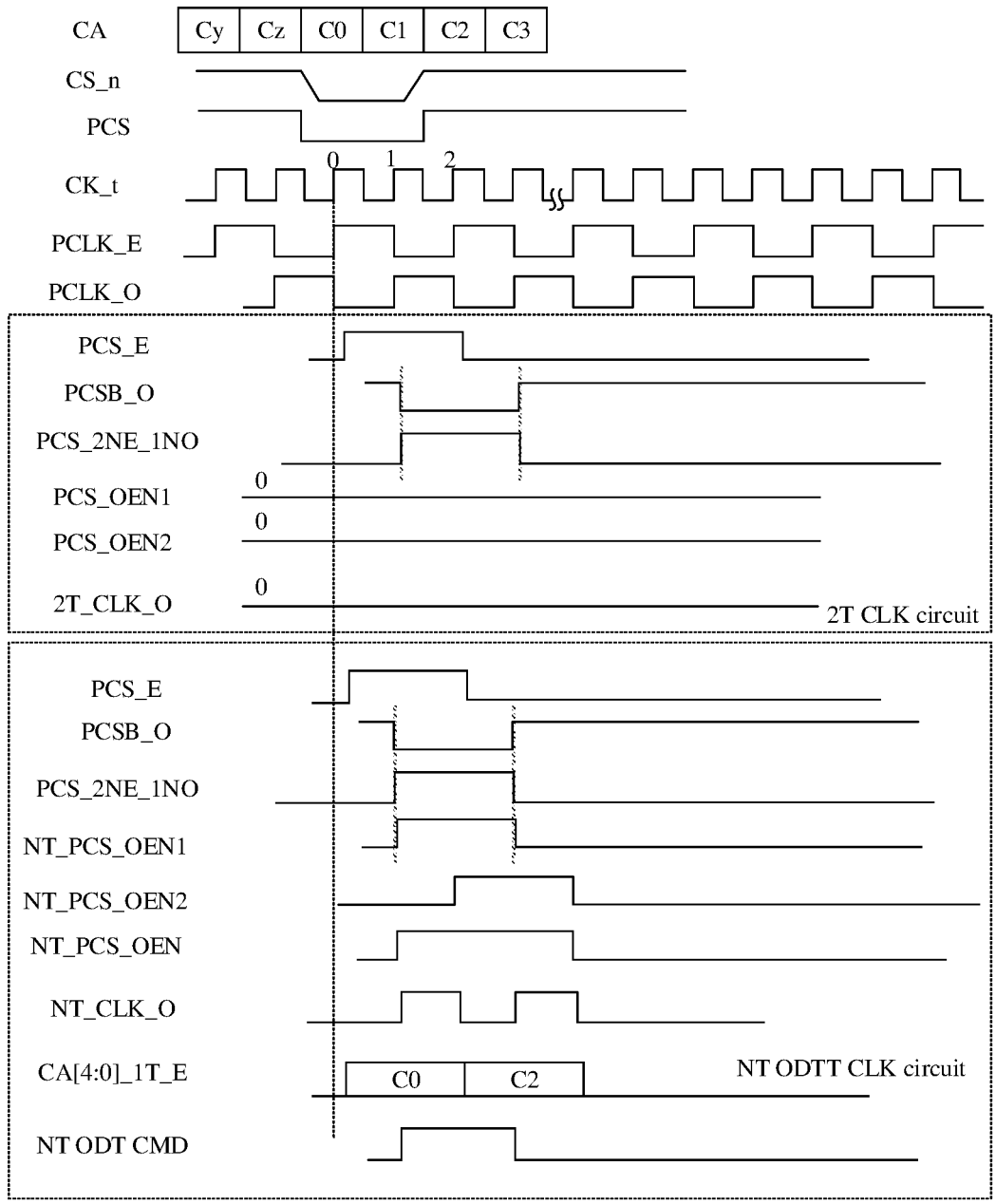
FIG. 8 is a schematic diagram of a signal timing sequence of another signal sampling circuit according to an embodiment of the present disclosure.

Scenario 2: as shown in FIG. 8, it is assumed that it is in the 1N MODE, and the first chip select signal is at a low level when sampled at the rising edge of an even clock cycle and still at the low level when sampled at the rising edge of a next adjacent odd clock cycle.

At this time, as shown in FIG. 8, the CA signal is sampled by using a PCLK_E signal to obtain a CA [4:0]_1T_E signal, which includes C0 and C2. The PCS signal is sampled and inverted by using the PCLK_E signal to obtain a PCS_E signal, which is a high active pulse signal, with a pulse width that is twice the preset clock period. The PCS signal is sampled and inverted by using the PCLK_O signal to obtain PCS_O (not shown in FIG. 7, but waveform thereof may refer to PCS_2NE_1NO), which is a high active pulse signal, with a pulse width that is twice the preset clock period. However, the rising edge of the PCS_O signal is delayed by a preset clock period compared with the rising edge of the PCS_E signal.

In the 2T CLK circuit, the PCS_E signal is sampled and inverted by using the PCLK_2NE_1NO signal (essentially the PCLK_O signal) to obtain a PCSB_O signal, which is a low active pulse signal, with a pulse width that is twice the preset clock cycle, but is delayed by a preset clock cycle compared with the PCS_B signal. The PCSB_O signal and PCS_2NE_1NO (actually PCS_O signal) are subjected to NOR operation, the two cancel each other out to obtain the PCS_OEN1 signal which is always at a low level, and then the 2T_CLK_O signal is an invalid signal which is always at a low level. Meanwhile, the 2T_CLK_E signal in this case is an invalid signal which is always at a low level. Therefore, neither the 2T_CLK_O signal nor the 2T_CLK_E signal will lead to valid decoding and sampling, and the 2 CMD signal cannot be obtained.

In the NT ODT CLK circuit, the PCS_E signal is sampled and inverted by using the PCLK_2NE_1NO signal (actually the PCLK_O signal) to obtain the PCSB_O signal, which is a low active pulse signal, with a pulse width that is twice the preset clock cycle. The inverted signal of the PCSB_O signal and the inverted signal of the PCS_2NE_1NO (actually the PCS_O signal) are subjected to NOR operation to obtain a NT_PCS_OEN1 signal, which is a high active pulse signal, with a pulse width that is twice the preset clock period. The NT_PCS_OEN1 signal is sampled by using the falling edge of the PCLK_2NE_1NO signal to obtain an NT_PCS_OEN2 signal, which is also a high active pulse signal, with a pulse width that is twice the preset clock cycle, but is delayed by a preset clock cycle compared with the NT_PCS_OEN1 signal. Thus, the NT_PCS_OEN1 signal and the NT_PCS_OEN2 signal are subjected to OR operation to obtain an NT_PCS_OEN signal, with a pulse width that is three times the preset clock period. That is, the third OR gate 538 plays a role in widening the pulse width. The NT_PCS_OEN signal with the PCLK_2NE_1NO signal is subjected to AND logic to obtain an NT_CLK_O, which includes two pulses, each with a pulse width of the preset clock period. Meanwhile, the NT_CLK_E signal in this case is an invalid signal which is always at a low level. Therefore, through the second command decoding flip-flop 422, the CA[4:0]_1T_E signal is decoded and sampled using the NT_CLK_O signal to obtain an NT ODT CMD signal. The NT ODT CMD signal is a high active pulse signal, with a pulse width of twice the preset clock period. Herein, the rising edge of a first pulse in the NT_CLK_O signal is configured to generate a rising edge of the NT ODT CMD signal, and the rising edge of a second pulse in the NT_CLK_O signal is configured to generate a falling edge of the NT ODT CMD signal.

In brief, as shown in FIG. 8, the CS_n signal has a low level that lasts for two preset clock cycles, and becomes a PCS_E/O signal after being respectively sampled by using the PCLK_E/O signal. Then the PCS_E/O signal becomes a PCSB_O/E signal after being sampled by using the PCLK_2NE_1NO/PCLK_2NO_1NE signal. The PCSB_O/E signals and the PCS_2NE_1NO/PCS_2NO_1NE signals are subjected to NOR operation, and both the obtained PCS_OEN1/2 signals and PCS_EEN1/2 signals are at a low level, which does not cover clock sampling, so the 2T CMD signal will not be output. However, in another branch circuit, the inverted signals of the PCSB_O signal and the PCS_2NE_1NO signal are subjected to NOR logic, thus generating NT_PCS_OEN1/2 to cover the NT_CLK_O signal with two pulses. Finally, the NT_CLK_O signal is used to sample the CA[4:0]_1T_E signal and the PCS_E signal to output the NT ODT CMD signal.

Similarly, if the first chip select signal is at a low level when sampled at the rising edge of an odd clock cycle and still at the low level when sampled at the rising edge of the next adjacent even clock cycle, the NT_CLK_E signal includes two pulses, each with a pulse width of the preset clock cycle, but the NT_CLK_O signal is an invalid signal which is always at a low level. Therefore, through the second command decoding flip-flop 422, the CA[4:0]_1T_O signal is decoded and sampled using the NT_CLK_E signal to obtain an NT ODT CMD signal. Moreover, the NT ODT CMD signal is a high active pulse signal, with a pulse width that is twice the preset clock period. Herein, the rising edge of a first pulse in the NT_CLK_E signal is configured to generate a rising edge of the NT ODT CMD signal, and the rising edge of a second pulse in the NT_CLK_E signal is configured to generate a falling edge of the NT ODT CMD signal. In addition, since both the 2T_CLK_O signal and the 2T_CLK_E signal are invalid signals which are always at a low level, neither the 2T_CLK_O signal nor the 2T_CLK_E signal will lead to valid decoding and sampling, and the 2T CMD signal cannot be obtained.

Figure 9:
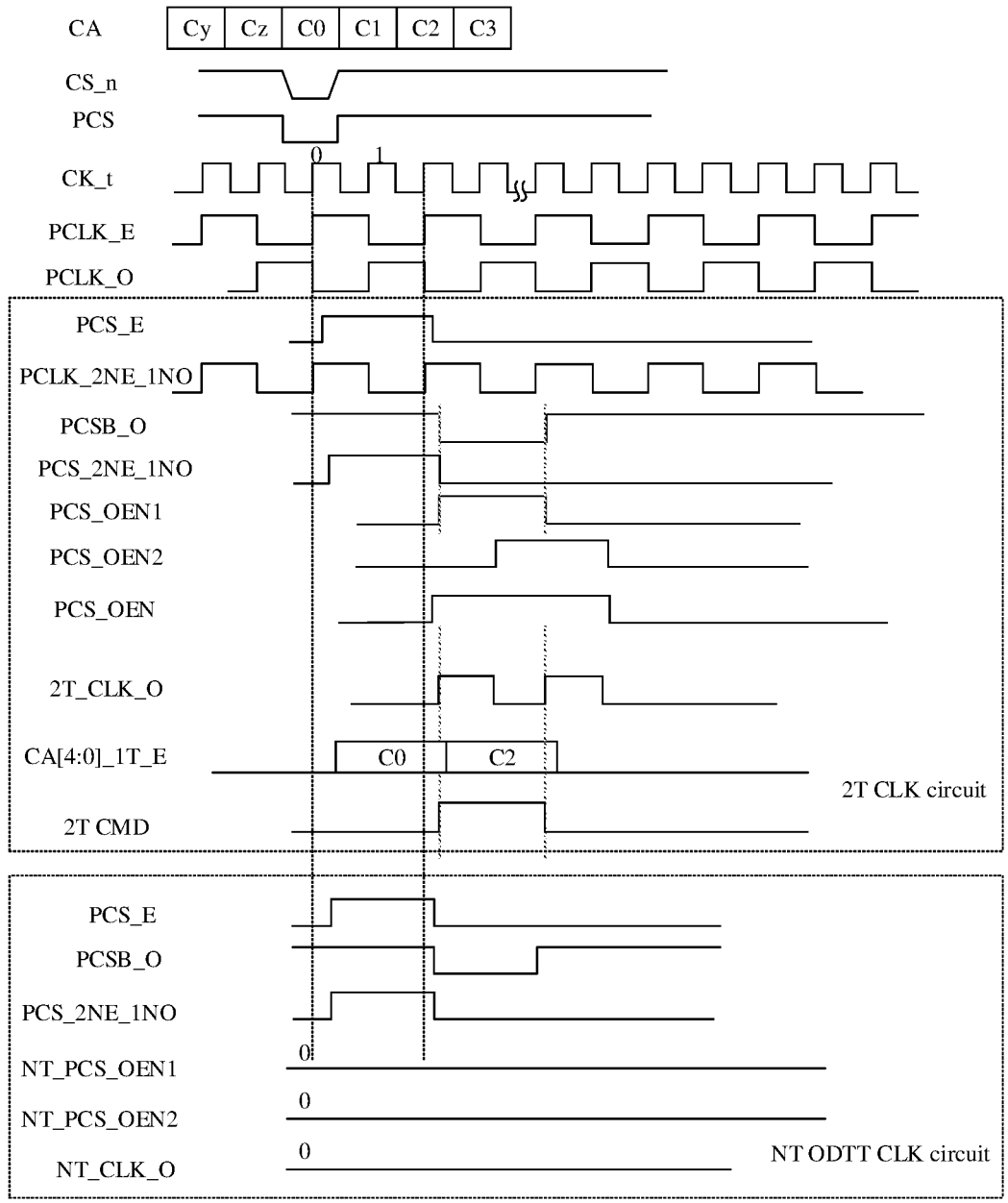
FIG. 9 is a schematic diagram of a signal timing sequence of yet another signal sampling circuit according to an embodiment of the present disclosure.

Scenario 3: as shown in FIG. 9, it is assumed that it is in the 2N MODE and the first chip select signal is at a low level when sampled at the rising edge of an even clock cycle and at a high level when sampled at the rising edge of a next adjacent odd clock cycle.

At this time, as shown in FIG. 9, the CA signal is sampled by using a PCLK_E signal to obtain a CA [4:0]_1T_E signal, which includes C0 and C2. The PCS signal is sampled and inverted by using the PCLK_E signal to obtain a PCS_E signal, which is a high active pulse signal, with a pulse width that is twice the preset clock period. The PCS signal is sampled and inverted by using the PCLK_O signal to obtain PCS_O (not shown in FIG. 9), which is always a low-level signal.

In the 2T CLK circuit, the PCS_E signal is sampled and inverted by using the PCLK_2NE_1NO signal (essentially the PCLK_E signal) to obtain the PCSB_O signal, which is a low active pulse signal, with a pulse width that is twice the preset clock cycle. The PCSB_O signal and the PCS_2NE_1NO signal (essentially the PCS_E signal) are subjected to NOR operation to obtain a PCS_OEN1 signal, which is a high active pulse signal, with a pulse width that is twice the preset clock period. The PCS_OEN1 signal is sampled by using the falling edge of the PCLK_2NE_1NO signal to obtain a PCS_OEN2 signal, which is also a high active pulse signal, with a pulse width that is twice the preset clock cycle, but is delayed by a preset clock cycle compared with the PCS_OEN1 signal. Thus, the PCS_OEN1 signal and the PCS_OEN2 signal are subjected to OR logic and then subjected to AND logic with the PCLK_2NE_1NO signal, to obtain a 2T_CLK_O signal, which includes two pulses, each with a pulse width of the preset clock period. Meanwhile, the 2T_CLK_E signal in this case is always an an invalid signal which is always at a low level. Therefore, through the first command decoding flip-flop 421, the CA[4:0]_1T_E signal is decoded and sampled by using the 2T_CLK_O signal to obtain a 2T CMD signal. Moreover, the 2T CMD is a high active pulse signal, with a pulse width that is twice the preset clock period. Herein, the rising edge of a first pulse in the 2T_CLK_O signal is configured to generate a rising edge of the 2T CMD signal, and the rising edge of a second pulse in the 2T_CLK_O signal is configured to generate a falling edge of the 2T CMD signal.

In the NT ODT CLK circuit, the PCS_E signal is sampled and inverted by using the PCLK_2NE_1NO signal to obtain the PCSB_O signal, which is a low active pulse signal, with a pulse width that is twice the preset clock cycle. The inverted signal of the PCSB_O signal and the inverted signal of the PCS_2NE_1NO (actually the PCS_E signal) are subjected to NOR operation and just cancel each other out to obtain the NT_PCS_OEN1 signal which is always a low-level signal, and then NT_PCS_OEN2 is always a low-level signal, so the NT_CLK_O signal is an invalid signal which is always at a low level. Meanwhile, the NT_CLK_E signal in this case is an invalid signal which is always at a low level. Therefore, neither the NT_CLK_O signal nor the NT_CLK_E signal will lead to valid decoding and sampling, and the NT ODT CMD signal cannot be obtained.

In brief, in the 2N MODE, for the 2T CMD signal, as shown in FIG. 9, the CS_n signal is at a low level only in one preset clock cycle, and becomes the PCS_E signal after being sampled by using the PCLK_E signal and then becomes the PCSB_O signal after being sampled by using PCLK_2NE_1NO. Herein, the PCSB_O signal and the PCS_2NE_1NO signal are subjected to NOR logic and then sampled to generate the PCS_OEN1/2 signal to cover the 2T_CLK_O signal. Finally, the 2T_CLK_O signal is used to sample the CA[4:0]_1T_E signal and the PCS_E signal to output the 2T CMD signal. However, in another branch circuit, the inverted signal of the PCSB_O/E signal and the inverted signal of the PCS_2NE_1NO/PCS_2NO_1NE signal are subjected to NOR logic, which leads to both the NT_PCS_OEN1/2 signal and the NT_PCS_EEN1/2 signal being at a low level, without covering clock sampling, so the NT ODT CMD signal is not output.

Similarly, if the first chip select signal is at a low level when sampled at the rising edge of an odd clock cycle and at a high level when sampled at the rising edge of the next adjacent even clock cycle, at this time, the 2T_CLK_E signal includes two pulses, each with a width of the preset clock cycle, but the 2T_CLK_O signal is an invalid signal which is always at a low level. Thus, through the first command decoding flip-flop 421, the CA[4:0]_1T_O signal is subjected to decoding and sampling according to the 2T_CLK_E signal to obtain the 2T CMD signal. Herein, the rising edge of the first pulse in the 2T_CLK_E signal is configured to generate the rising edge of the 2T CMD signal, and the rising edge of the second pulse in the 2T_CLK_E signal is configured to generate the falling edge of the 2T CMD signal. In addition, since both the NT_CLK_O signal and the NT_CLK_E signal are invalid signals which are always at a low level, neither the NT_CLK_O signal nor the NT_CLK_E signal will lead to valid decoding and sampling, and the NT ODT CMD signal cannot be obtained.

Figure 10:
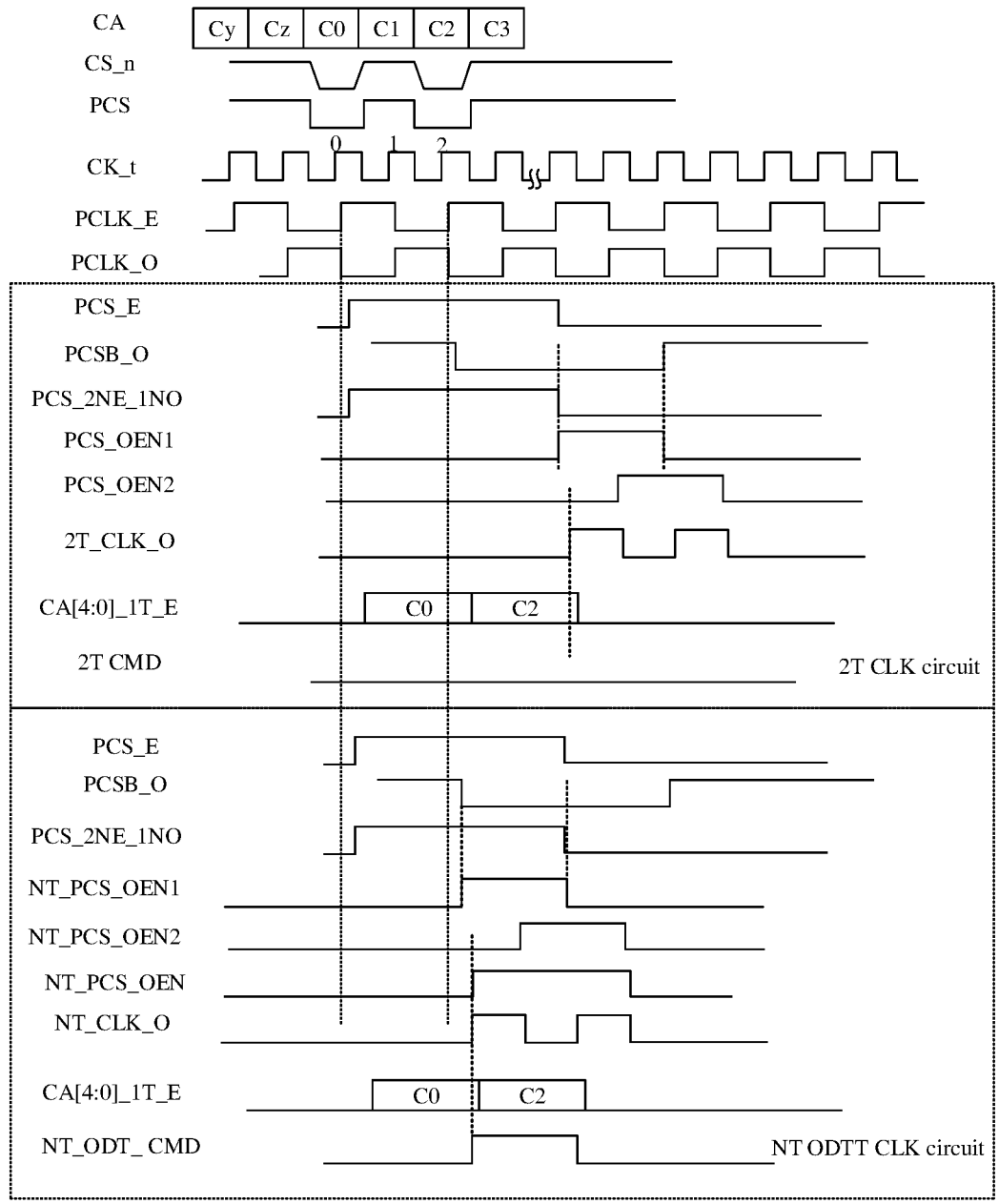
FIG. 10 is a schematic diagram of a signal timing sequence of still another signal sampling circuit according to an embodiment of the present disclosure.

Scenario 4: as shown in FIG. 10, it is assumed that it is in the 2N MODE and the first chip select signal is at a low level when sampled at the rising edges of two consecutive even clock cycles and at a high level when sampled at the rising edge of an odd clock cycle between the two consecutive even clock cycles.

At this time, as shown in FIG. 10, the CA signal is sampled by using a PCLK_E signal to obtain a CA[4:0]_1T_E signal, which includes C0 and C2. The PCS signal is sampled and inverted by using the PCLK_E signal to obtain a PCS_E signal, which is a high active pulse signal, with a pulse width of four times the preset clock period. The PCS signal is sampled and inverted by using the PCLK_O signal to obtain a PCS_O signal (not shown in FIG. 10), which is always at a low level.

In the 2T CLK circuit, the PCS_E signal is sampled and inverted by using the PCLK_2NE_1NO signal (actually the PCLK_E signal) to obtain the PCSB_O signal, which is a low active pulse signal, with a pulse width that is four times the preset clock cycle. The PCSB_O signal and PCS_2NE_1NO (actually the PCS_E signal) are subjected to NOR operation to obtain the PCS_OEN1 signal, which is a high active pulse signal, but the rising edge of the PCS_OEN1 signal is later than the valid content C0 of the CA[4:0]_1T_E signal. The PCS_OEN1 signal is sampled by using the falling edge of the PCLK_2NE_1NO signal to obtain the PCS_OEN2 signal, which is also a high active pulse signal, with a pulse width that is twice the preset clock cycle, but is delayed by a preset clock cycle compared with the PCS_OEN1 signal. Thus, the PCS_OEN1 signal and the PCS_OEN2 signal are subjected to OR logic and then subjected to AND logic with the PCLK_2NE_1NO signal to obtain a 2T_CLK_O signal, which includes two pulses, each with a pulse width of the preset clock cycle, but the rising edge of the first pulse of the 2T_CLK_O signal is later than the valid content C0 of the CA[4:0]_1T_E signal. Therefore, the 2T_CLK_O signal will not lead to valid decoding and sampling, and the 2T CMD signal cannot be obtained. Meanwhile, the 2T_CLK_E signal in this case is an invalid signal which is always at a low level. Therefore, the 2T_CLK_E signal does not lead to valid decoding and sampling as well, and the 2T CMD signal cannot be obtained.

In the NT ODT CLK circuit, the PCS_E signal is sampled and inverted by using the PCLK_2NE_1NO signal (essentially the PCLK_E signal) to obtain the PCSB_O signal, which is a low active pulse signal, with a pulse width that is four times the preset clock cycle. The inverted signal of the PCSB_O signal and the inverted signal of the PCS_2NE_1NO (actually the PCS_E signal) are subjected to NOR operation to obtain a NT_PCS_OEN1 signal, which is a high active pulse signal, with a pulse width that is twice the preset clock period. The PCS_OEN1 signal is sampled by the falling edge of the PCLK_2NE_1NO signal to obtain an NT_PCS_OEN2 signal, which is also a high active pulse signal, with a pulse width that is twice the preset clock cycle, but is delayed by a preset clock cycle compared with the NT_PCS_OEN1 signal. Thus, the NT_PCS_OEN1 signal and the NT_PCS_OEN2 signal are subjected to OR logic and then subjected to AND logic with the PCLK_2NE_1NO signal to obtain an NT_CLK_O signal, which includes two pulses, each with a pulse width of the preset clock period. Meanwhile, the NT_CLK_E signal in this case is an invalid signal which is always at a low level. Therefore, through the second command decoding flip-flop 422, the CA[4:0]_1T_E signal is decoded and sampled by using the NT_CLK_O signal to obtain an NT ODT CMD signal. Moreover, the NT ODT CMD signal is a high active pulse signal, with a pulse width that is twice the preset clock period. Herein, the rising edge of a first pulse in the NT_CLK_O signal is configured to generate a rising edge of the NT ODT CMD signal, and the rising edge of a second pulse in the NT_CLK_O signal is configured to generate a falling edge of the NT ODT CMD signal.

In brief, for the NT ODT CMD signal, as shown in FIG. 10, the CS_n signal is at a low level in two interval cycles, and becomes a PCSB_E/O signal after being sampled by using the PCLK_E/O signal. Then the PCS_E signal becomes the PCSB_O signal after being sampled by the PCLK_2NE_1NO signal, and after the PCSB_O signal and the PCS_2NE_1NO signal are subjected to NOR logic, a PCS_OEN1/2 signal is obtained, and the PCS_OEN1/2 signal is a high active pulse signal. However, the rising edge of the PCS_OEN1/2 signals is later than the valid content C0 of the CA[4:0]_1T_E signal, so the 2T_CLK_O signal does not lead to valid decoding sampling, and the 2T CMD signal cannot be obtained. Meanwhile, the PCS_O signal becomes the PCSB_E signal after being sampled by using the PCLK_2NO_1NE signal. After the PCSB_E signal and the PCS_2NO_1NE signal are subjected to NOR logic, the PCS_EEN1/2 signal is always at a low level, which does not cover clock sampling, so the 2T CMD signal will not be output. However, in another branch circuit, the inverted signal of the PCSB_O signal and the inverted signal of the PCS_2NE_1NO signal are subjected to NOR logic, thus generating NT_PCS_OEN1/2 to cover the NT_CLK_O signal with two pulses. Finally, the NT_CLK_O signal is used to sample the CA[4:0]_1T_E signal and the PCS_E signal to output the NT ODT CMD signal.

Similarly, if the first chip select signal is at a low level when sampled at the rising edge of two consecutive odd clock cycles and at a high level when sampled at the rising edge of the even clock cycle between the two consecutive odd clock cycles, the NT_CLK_E signal includes two pulses, each with a width of the preset clock cycle, but the NT_CLK_E signal is an invalid signal which is always at a low level. Thus, through the second command decoding flip-flop 422, the CA[4:0]_1T_O signal is subjected to decoding and sampling according to the NT_CLK_E signal to obtain the NT ODT CMD signal. Herein, the rising edge of a first pulse in the NT_CLK_E signal is configured to generate a rising edge of the NT ODT CMD signal, and the rising edge of a second pulse in the NT_CLK_E signal is configured to generate a falling edge of the NT ODT CMD signal. In addition, the 2T_CLK_O signal is an invalid signal which is always at a low level. Although there are two pulses in the 2T_CLK_E signal, the rising edge thereof is later than the valid content of the CA[4:0]_1T_O signal, so the 2T_CLK_O signal is also an invalid signal. Neither the 2T_CLK_O signal nor the 2T_CLK_E signal will lead to valid decoding and sampling, so the 2T CMD signal cannot be obtained.

The embodiment of the disclosure provides a signal sampling circuit. The specific implementation of the aforementioned embodiments is described in detail through the embodiment. It is to be seen that, based on the technical solution of the embodiment of the disclosure, the signal sampling circuit 30 in the embodiment of the disclosure can decode the 2T CMD signal and the NT ODT CMD signal respectively in different cycle modes without affecting each other, and it is unnecessary to arrange an independent decoding circuit for each cycle mode, thus saving circuit area and reducing power consumption.

Figure 11:
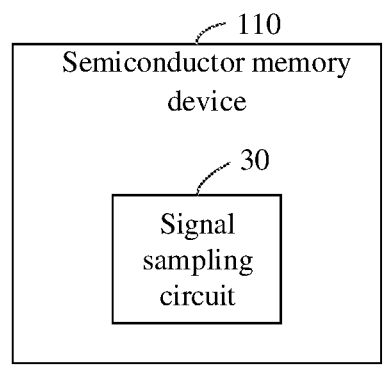
FIG. 11 is a composition structure diagram of a semiconductor memory device according to an embodiment of the present disclosure.

In yet another embodiment of the disclosure, referring to FIG. 11, FIG. 11 is a structure diagram of a semiconductor memory device 110 according to an embodiment of the present disclosure. As shown in FIG. 11, the semiconductor memory device 110 may include the signal sampling circuit 30 of any of the previous embodiments.

In some embodiments of the disclosure, the semiconductor memory device 110 is a DRAM chip.

Further, in some embodiments, the DRAM chip meets the DDR5 memory specification.

It is to be noted that the embodiments of the present disclosure mainly relate to relevant circuits of input signal sampling and command decoding in integrated circuit design, and in particular to a control and regulation circuit in the DRAM chip, where CA signal input in different cycle modes is used as command and address sampling and decoding respectively. Specifically, the technical solution of the embodiment of the present disclosure solves the difficulty in distinguishing sampling and decoding of 2T CMD and NT ODT CMD in different cycle modes in DDR5, and commands with different pulse shapes of the CS_n signal may be decoded into the 2T CMD signal and the NT ODT CMD signal respectively without affecting each other.

In addition, it is also to be noted that the technical solution of the embodiment of the present disclosure may be applied to the control circuit of CA signal sampling and decoding in the DRAM chip, but is not limited thereto, and relevant circuits of other input signal sampling and command decoding may adopt the design.

Thus, in the embodiment of the disclosure, the semiconductor memory device 120 may include a signal sampling circuit 30. Therefore, based on the signal sampling circuit, a target mode clock signal and a target mode chip select signal are determined according to a cycle mode, so that for the first chip select signal with a respective one of different pulse shapes, a corresponding first chip select clock signal and second chip select clock signal are obtained. Therefore, 2T CMD and NT ODT CMD are correctly distinguished and accurately decoded in different cycle modes, the problem of executing a wrong operation caused by a command decoding error can be avoided, and meanwhile, the circuit area is saved and the power consumption is reduced.

The foregoing descriptions are only preferred embodiments of the disclosure and are not intended to limit the scope of protection of the disclosure. It is to be noted that terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Without further restrictions, the element defined by the statement "including a . . . " does not exclude the existence of another same element in the process, method, article or device including the element. The sequence numbers of the embodiments of the disclosure are adopted not to represent superiority-inferiority of the embodiments but only for description. The methods disclosed in several method embodiments provided in the present disclosure may be arbitrarily combined without conflict to obtain a new method embodiment. The characteristics disclosed in a plurality of product embodiments provided in the present disclosure may be arbitrarily combined without conflict to obtain a new product embodiment. The characteristics disclosed in the several method or device embodiments provided in the present disclosure may be arbitrarily combined without conflict to obtain a new method embodiment or device embodiment. The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

The embodiments of the disclosure provide a signal sampling circuit and a semiconductor memory device. Based on the signal sampling circuit, a target mode clock signal and a target mode chip select signal are determined according to a cycle mode of the signal sampling circuit, so that for a first chip select signal with a respective one of different pulse shapes, a corresponding first chip select clock signal and second chip select clock signal are obtained. Therefore, the two commands 2T CMD and NT ODT CMD are correctly distinguished and accurately decoded in different cycle modes, the problem of executing a wrong operation caused by a command decoding error can be avoided, and meanwhile, the circuit area is saved and the power consumption is reduced.

The invention claimed is:

1. A signal sampling circuit, comprising a signal input circuit, a mode selection circuit, a first clock processing circuit, a second clock processing circuit and a command decoding circuit, wherein
the signal input circuit is configured to determine a to-be-processed command signal and a to-be-processed chip select signal according to a first clock signal, a first chip select signal and a first command address signal, a clock cycle of the first clock signal being twice a preset clock cycle,
wherein the mode selection circuit is configured to perform, in response to a mode selection signal indicating a target mode, selection processing on the first clock signal and the to-be-processed chip select signal according to the mode selection signal, to obtain a target mode clock signal and a target mode chip select signal, wherein the first clock processing circuit is configured to perform, when the first chip select signal includes a pulse with a pulse width of the preset clock cycle, sampling and logic operation on the to-be-processed chip select signal and the target mode chip select signal according to the target mode clock signal, to obtain a first chip select clock signal, wherein the second clock processing circuit is configured to perform, when the first chip select signal includes a pulse with a pulse width that is twice the preset clock cycle, or the first chip select signal includes two pulses, each with a pulse width of the preset clock cycle, sampling and logic operation on the to-be-processed chip select signal and the target mode chip select signal according to the target mode clock signal, to obtain a second chip select clock signal, and wherein the command decoding circuit is configured to perform decoding and sampling on the to-be-processed command signal according to the to-be-processed chip select signal and the first chip select clock signal, to obtain a target command signal; or, perform decoding and sampling on the to-be-processed command signal according to the to-be-processed chip select signal and the second chip select clock signal, to obtain a target command signal.

2. The signal sampling circuit of claim 1, wherein in a case where the target mode is a 1N MODE, the first clock processing circuit is configured to perform, when the first chip select signal comprises a pulse with a pulse width of the preset clock cycle, sampling and logic operation on the to-be-processed chip select signal and the target mode chip select signal corresponding to the 1N MODE according to the target mode clock signal corresponding to the 1N MODE, to obtain the first chip select clock signal, and the second clock processing circuit is configured to perform, when the first chip select signal comprises a pulse with a pulse width that is twice the preset clock cycle, sampling and logic operation on the to-be-processed chip select signal and the target mode chip select signal corresponding to the 1N MODE according to the target mode clock signal corresponding to the 1N MODE, to obtain the second chip select clock signal, or, wherein in a case where the target mode is a 2N MODE, the first clock processing circuit is configured to perform, when the first chip select signal comprises a pulse with a pulse width of the preset clock cycle, sampling and logic operation on the to-be-processed chip select signal and the target mode chip select signal corresponding to the 2N MODE according to the target mode clock signal corresponding to the 2N MODE to obtain the first chip select clock signal, and the second clock processing circuit is configured to perform, when the first chip select signal comprises two pulses, each with a pulse width of the preset clock cycle, sampling and logic operation on the to-be-processed chip select signal and the target mode chip select signal corresponding to the 2N MODE according to the target mode clock signal corresponding to the 2N MODE, to obtain the second chip select clock signal.

3. The signal sampling circuit of claim 1, wherein the signal input circuit comprises a first receiving circuit, a second receiving circuit, a third receiving circuit and an input sampling circuit, wherein the first receiving circuit is configured to receive an initial command address signal and output the first command address signal, the second receiving circuit is configured to receive an initial chip select signal and output the first chip select signal, the third receiving circuit is configured to receive an initial clock signal, perform frequency division on the initial clock signal, and output a first odd clock signal and a first even clock signal, and the input sampling circuit is configured to perform sampling on the first chip select signal and the first command address signal according to the first clock signal, to obtain the to-be-processed chip select signal and the to-be-processed command signal, wherein the clock cycle of the initial clock signal is the preset clock cycle, the first clock signal is composed of the first odd clock signal and the first even clock signal, both clock cycles of the first odd clock signal and the first even clock signal are twice the preset clock cycle, and a phase difference between the first odd clock signal and the first even clock signal is 180 degrees.

4. The signal sampling circuit of claim 3, wherein the input sampling circuit comprises a first sampling circuit, a second sampling circuit, a third sampling circuit and a fourth sampling circuit, wherein the first sampling circuit is configured to perform sampling on the first command address signal according to the first even clock signal to obtain a to-be-processed even command signal, the second sampling circuit is configured to perform sampling on the first command address signal according to the first odd clock signal to obtain a to-be-processed odd command signal, the third sampling circuit is configured to perform sampling and phase inverting on the first chip select signal according to the first even clock signal to obtain a to-be-processed even chip select signal, and the fourth sampling circuit is configured to perform sampling and phase inverting on the first chip select signal according to the first odd clock signal, to obtain a to-be-processed odd chip select signal, wherein the to-be-processed command signal is composed of the to-be-processed even command signal and the to-be-processed odd command signal, and the to-be-processed chip select signal is composed of the to-be-processed even chip select signal and the to-be-processed odd chip select signal.

5. The signal sampling circuit of claim 4, wherein the first sampling circuit comprises a first flip-flop, an input end of the first flip-flop is connected to the first command address signal, a clock end of the first flip-flop is connected to the first even clock signal, and an output end of the first flip-flop is configured to output the to-be-processed even command signal, wherein the second sampling circuit comprises a second flip-flop, an input end of the second flip-flop is connected to the first command address signal, a clock end of the second flip-flop is connected to the first odd clock signal, and an output end of the second flip-flop is configured to output the to-be-processed odd command signal, wherein the third sampling circuit comprises a third flip-flop and a first inverter, an input end of the third flip-flop is connected to the first chip select signal, a clock end of the third flip-flop is connected to the first even clock signal, an output end of the third flip-flop is connected to an input end of the first inverter, and an output end of the first inverter is configured to output the to-be-processed even chip select signal, and wherein the fourth sampling circuit comprises a fourth flip-flop and a second inverter, an input end of the fourth flip-flop is connected to the first chip select signal, a clock end of the fourth flip-flop is connected to the first odd clock signal, an output end of the fourth flip-flop is connected to an input end of the second inverter, and an output end of the second inverter is configured to output the to-be-processed chip select signal.

6. The signal sampling circuit of claim 5, wherein the mode selection circuit comprises a first selection circuit, a second selection circuit, a third selection circuit, and a fourth selection circuit, wherein the first selection circuit is configured to perform selection processing on the first odd clock signal and the first even clock signal according to the mode selection signal, to obtain a first mode clock signal in the target mode clock signal, the second selection circuit is configured to perform selection processing on the first odd clock signal and the first even clock signal according to the mode selection signal, to obtain a second mode clock signal in the target mode clock signal, the third selection circuit is configured to perform selection processing on the to-be-processed odd chip select signal and the to-be-processed even chip select signal according to the mode selection signal, to obtain a first mode chip select signal in the target mode chip select signal, and the fourth selection circuit is configured to perform selection processing on the to-be-processed odd chip select signal and the to-be-processed even chip select signal according to the mode selection signal, to obtain a second mode chip select signal in the target mode chip select signal.

7. The signal sampling circuit of claim 6, wherein the mode selection circuit is configured to, in response to the mode selection signal indicating a 1N MODE, select the first odd clock signal to generate the first mode clock signal, select the first even clock signal to generate the second mode clock signal, select the to-be-processed odd chip select signal to generate the first mode chip select signal, and select the to-be-processed even chip select signal to generate the second mode chip select signal, or the mode selection circuit is configured to, in response to the mode selection signal indicating a 2N MODE, select a first even clock signal to generate the first mode clock signal, select the first odd clock signal to generate the second mode clock signal, select the to-be-processed even chip select signal to generate the first mode chip select signal, and select the to-be-processed odd chip select signal to generate the second mode chip select signal.

8. The signal sampling circuit of claim 7, further comprising:

in response to the target mode being the 1N MODE, determining that the mode selection signal is in a first level state; or in response to the target mode being the 2N MODE, determining that the mode selection signal is in a second level state.

9. The signal sampling circuit of claim 6, wherein the first selection circuit comprises a first multiplexer, the second selection circuit comprising a second multiplexer, the third selection circuit comprising a third multiplexer, and the fourth selection circuit comprising a fourth multiplexer, wherein a first input end of the first multiplexer is connected to the first even clock signal, a second input end of the first multiplexer is connected to the first odd clock signal, and an output end of the first multiplexer is configured to output the first mode clock signal, wherein a first input end of the second multiplexer is connected to the first odd clock signal, a second input end of the second multiplexer is connected to the first even clock signal, and an output end of the second multiplexer is configured to output the second mode clock signal, wherein a first input end of the third multiplexer is connected to the to-be-processed even chip select signal, a second input end of the third multiplexer is connected to the to-be-processed odd chip select signal, and an output end of the third multiplexer is configured to output the first mode chip select signal, wherein a first input end of the fourth multiplexer is connected to the to-be-processed odd chip select signal, a second input end of the fourth multiplexer is connected to the to-be-processed even chip select signal, and an output end of the fourth multiplexer is configured to output the second mode chip select signal, wherein control ends of the first multiplexer, the second multiplexer, the third multiplexer and the fourth multiplexer are all connected to the mode selection signal.

10. The signal sampling circuit of claim 6, wherein the first clock processing circuit comprises a first logic circuit and a second logic circuit, and the second clock processing circuit comprises a third logic circuit and a fourth logic circuit, wherein the first logic circuit is configured to receive the first mode clock signal and the first mode chip select signal, and perform sampling and logic operation on the to-be-processed even chip select signal and the first mode chip select signal by using the first mode clock signal, to obtain a first odd chip select clock signal, the second logic circuit is configured to receive the second mode clock signal and the second mode chip select signal, and perform sampling and logic operation on the to-be-processed odd chip select signal and the second mode chip select signal by using the second mode clock signal, to obtain a first even chip select clock signal, the third logic circuit is configured to receive the first mode clock signal and the first mode chip select signal, and perform sampling and logic operation on the to-be-processed even chip select signal and the first mode chip select signal by using the first mode clock signal, to obtain a second odd chip select clock signal, and the fourth logic circuit is configured to receive the second mode clock signal and the second mode chip select signal, and perform sampling and logic operation on the to-be-processed odd chip select signal and the second mode chip select signal by using the second mode clock signal, to obtain a second even chip select clock signal, wherein the first chip select clock signal is composed of the first even chip select clock signal and the first odd chip select clock signal, the second chip select clock signal is composed of the second odd chip select clock signal and the second even chip select clock signal.

11. The signal sampling circuit of claim 10, wherein
the first logic circuit comprises a fifth sampling circuit, a first NOR gate, a first NOT gate, a sixth sampling circuit, a first OR gate and a first AND gate, wherein
the fifth sampling circuit is configured to perform sampling and phase inverting on the to-be-processed even chip select signal by using the first mode clock signal, to obtain a first intermediate odd sampling signal,
the first NOR gate is configured to perform NOR operation on the first intermediate odd sampling signal and the first mode chip select signal, to obtain a second intermediate odd sampling signal,
the first NOT gate is configured to perform NOT operation on the first mode clock signal, to obtain a first inverted odd clock signal,
the sixth sampling circuit is configured to perform sampling on the second intermediate odd sampling signal by using the first inverted odd clock signal, to obtain a third intermediate odd sampling signal,
the first OR gate is configured to perform OR operation on the second intermediate odd sampling signal and the third intermediate odd sampling signal, to obtain a fourth intermediate odd sampling signal, and
the first AND gate is configured to perform AND operation on the fourth intermediate odd sampling signal and the first mode clock signal, to obtain the first odd chip select clock signal,
wherein the second logic circuit comprises a seventh sampling circuit, a second NOR gate, a second NOT gate, an eighth sampling circuit, a second OR gate and a second AND gate, wherein
the seventh sampling circuit is configured to perform sampling and phase inverting on the to-be-processed odd chip select signal with the second mode clock signal, to obtain a first intermediate even sampling signal,
the second NOR gate is configured to perform NOR operation on the first intermediate even sampling signal and the second mode chip select signal, to obtain a second intermediate even sampling signal,
the second NOT gate is configured to perform NOT operation on the second mode clock signal, to obtain a first inverted even clock signal,
the eighth sampling circuit is configured to perform sampling on the second intermediate even sampling signal by using the first inverted even clock signal, to obtain a third intermediate even sampling signal,
the second OR gate is configured to perform OR operation on the second intermediate even sampling signal and the third intermediate even sampling signal, to obtain a fourth intermediate even sampling signal, and
the second AND gate is configured to perform AND operation on the fourth intermediate even sampling signal and the second mode clock signal, to obtain a first even chip select clock signal;
the third logic circuit comprises a ninth sampling circuit, a third NOT gate, a third NOR gate, a fourth NOT gate, a tenth sampling circuit, a third OR gate and a third AND gate, wherein
the ninth sampling circuit is configured to perform sampling and phase inverting on the to-be-processed even chip select signal by using the first mode clock signal, to obtain a fifth intermediate odd sampling signal,
the third NOT gate is configured to perform NOT operation on the first mode clock signal, to obtain a first mode inverted chip select signal,
the third NOR gate is configured to perform NOR operation on the fifth intermediate odd sampling signal and the first mode inverted chip select signal, to obtain a sixth intermediate odd sampling signal,
the fourth NOT gate is configured to perform NOT operation on the first mode clock signal, to obtain a first mode inverted clock signal,
the tenth sampling circuit is configured to perform sampling on the sixth intermediate odd sampling signal by using the first mode inverted clock signal, to obtain a seventh intermediate odd sampling signal,
the third OR gate is configured to perform OR operation on the sixth intermediate odd sampling signal and the seventh intermediate odd sampling signal, to obtain an eighth intermediate odd sampling signal, and
the third AND gate is configured to perform AND operation on the eighth intermediate odd sampling signal and the first mode clock signal, to obtain a second odd chip select clock signal,
wherein the fourth logic circuit comprises an eleventh sampling circuit, a fifth NOT gate, a fourth NOR gate, a sixth NOT gate, a twelfth sampling circuit, a fourth OR gate and a fourth AND gate,
the eleventh sampling circuit is configured to perform sampling and phase inverting on the to-be-processed odd chip select signal by using the second mode clock signal, to obtain a fifth intermediate even sampling signal,
the fifth NOT gate is configured to perform NOT operation on the second mode chip select signal, to obtain a second mode inverted chip select signal,
the fourth NOR gate is configured to perform NOR operation on the fifth intermediate even sampling signal and the second mode inverted chip select signal, to obtain a sixth intermediate even sampling signal,
the sixth NOT gate is configured to perform NOT operation on the second mode clock signal, to obtain a second mode inverted clock signal,
the twelfth sampling circuit is configured to perform sampling on the sixth intermediate even sampling signal by using the second mode inverted clock signal, to obtain a seventh intermediate even sampling signal,
the fourth OR gate is configured to perform OR operation on the sixth intermediate even sampling signal and the seventh intermediate even sampling signal, to obtain an eighth intermediate even sampling signal, and
the fourth AND gate is configured to perform AND operation on the eighth intermediate even sampling signal and the second mode clock signal, to obtain the second even chip select clock signal.

12. The signal sampling circuit of claim 10, wherein the command decoding circuit comprises a first command decoding circuit and a second command decoding circuit, wherein
the first command decoding circuit is configured to receive the first chip select clock signal, and perform decoding and sampling on the to-be-processed command signal according to the first chip select clock signal and the to-be-processed chip select signal, to obtain a first target command signal,
the second command decoding circuit is configured to receive the second chip select clock signal, and perform decoding and sampling on the to-be-processed command signal according to the second chip select clock signal and the to-be-processed chip select signal, to obtain a second target command signal.

13. The signal sampling circuit of claim 12, wherein the first command decoding circuit comprises a first decoding and sampling circuit and a fifth OR gate, wherein
the first decoding and sampling circuit is configured to perform decoding and sampling on the to-be-processed even command signal according to the first odd chip select clock signal and the to-be-processed even chip select signal, to obtain a first even command signal; and perform decoding and sampling on the to-be-processed odd command signal according to the first even chip select clock signal and the to-be-processed odd chip select signal, to obtain a first odd command signal, and
the fifth OR gate is configured to perform OR operation on the first even command signal and the first odd command signal, to obtain the first target command signal,
wherein the second command decoding circuit comprises a second decoding and sampling circuit and a sixth OR gate, wherein
the second decoding and sampling circuit is configured to perform decoding and sampling on the to-be-processed even command signal according to the second odd chip select clock signal and the to-be-processed even chip select signal, to obtain a second even command signal; and perform decoding and sampling on the to-be-processed odd command signal according to the second even chip select clock signal and the to-be-processed odd chip select signal, to obtain a second odd command signal,
the sixth OR gate is configured to perform OR operation on the second even command signal and the second odd command signal, to obtain a second target command signal.

14. The signal sampling circuit of claim 13, wherein
the first decoding and sampling circuit comprises a first decoding circuit, a thirteenth sampling circuit, a second decoding circuit, and a fourteenth sampling circuit, wherein
the first decoding circuit is configured to perform decoding on the to-be-processed even chip select signal and the to-be-processed even command signal, to obtain a first even decoding signal,
the thirteenth sampling circuit is configured to perform sampling on the first even decoding signal according to the first odd chip select clock signal, to obtain the first even command signal,
the second decoding circuit is configured to perform decoding on the to-be-processed odd chip select signal and the to-be-processed odd command signal, to obtain a first odd decoding signal, and
the fourteenth sampling circuit is configured to perform sampling on the first odd decoding signal by using the first even chip select clock signal, to obtain the first odd command signal,
wherein the second decoding and sampling circuit comprises a third decoding circuit, a fifteenth sampling circuit, a fourth decoding circuit, and a sixteenth sampling circuit, wherein
the third decoding circuit is configured to perform decoding on the to-be-processed even chip select signal and the to-be-processed even command signal, to obtain a second even decoding signal,
the fifteenth sampling circuit is configured to perform sampling on the second even decoding signal according to the second odd chip select clock signal, to obtain a second even command signal,
the fourth decoding circuit is configured to perform decoding processing on the to-be-processed odd chip select signal and the to-be-processed odd command signal to obtain a second odd decoding signal, and
the sixteenth sampling circuit is configured to perform sampling on the second odd decoding signal by using the second even chip select clock signal, to obtain the second odd command signal.

15. The signal sampling circuit of claim 12, wherein the initial chip select signal is a signal that indicates that a target chip is selected, the initial chip select signal is a low active pulse signal,
wherein in response to the initial chip select signal comprising a pulse with a pulse width of the preset clock cycle, the first chip select clock signal is determined as a valid signal, and the first target command signal output by the first command decoding circuit is determined as the target command signal, and
wherein in response to the initial chip select signal comprising a pulse with a pulse width that is twice the preset clock cycle, or the initial chip select signal comprising two pulses, each with a pulse width of the preset clock cycle, the second chip select clock signal is determined as a valid signal, and the second target command signal output by the second command decoding circuit is determined as the target command signal.

16. The signal sampling circuit of claim 15, wherein
the target command signal is a Command signal in a DDR5 Dynamic Random Access Memory (DRAM) chip, the Command signal comprises a Read (RD) command signal, a Write (WE) command signal, a refresh command signal, a precharge command signal, and an activation command signal, and
the second target command signal is a Non-Target ODT Command signal in the DDR5 DRAM chip.

17. The signal sampling circuit of claim 16, further comprising:
when the target mode is a 1N MODE or a 2N MODE, and the initial chip select signal comprises a pulse with a pulse width of the preset clock cycle, determining that the first chip select clock signal comprises two pulses, each with a pulse width of the preset clock cycle, wherein a rising edge of a first pulse in the first chip select clock signal is configured to generate a rising edge of the first target command signal, a rising edge of a second pulse in the first chip select clock signal is configured to generate a falling edge of the first target command signal; and determining that the second chip select clock signal maintains a level state and the second target command signal maintains the level state,
when the target mode is the 1N MODE, and the initial chip select signal comprises a pulse with a pulse width that is twice the preset clock cycle, determining that the first chip select clock signal maintains the level state and the first target command signal maintains the level state, determining that the second chip select clock signal comprises two pulses, each with a pulse width of the preset clock cycle, wherein the rising edge of a first pulse in the second chip select clock signal is configured to generate a rising edge of the second target command signal, and the rising edge of a second pulse in the second chip select clock signal is configured to generate a falling edge of the second target command signal, when the target mode is the 2N MODE, and the initial chip select signal comprises two pulses, each with a pulse width of the preset clock cycle, determining that the first target command signal maintains the level state, wherein the second chip select clock signal comprise two pulses, each with a pulse width of the preset clock cycle, the rising edge of the first pulse in the second chip select clock signal is configured to generate a rising edge of the second target command signal, and the rising edge of the second pulse in the second chip select clock signal is configured to generate a falling edge of the second target command signal.

18. The signal sampling circuit of claim 17, further comprising:
in response to the target mode being the 1N MODE or the 2N MODE, and the initial chip select signal comprising a pulse with a pulse width of the preset clock cycle,
when the first chip select signal is at a low level when sampled at the rising edge of an even clock cycle and is at a high level when sampled at the rising edge of a next adjacent odd clock cycle, determining that the first odd chip select clock signal is a valid signal, and the first odd chip select clock signal has two pulses, wherein the rising edge of the first pulse in the first odd chip select clock signal is configured to generate the rising edge of the first target command signal, and the rising edge of the second pulse in the first odd chip select clock signal is configured to generate the falling edge of the first target command signal, or
when the first chip select signal is at a low level when sampled at the rising edge of an odd clock cycle and is at a high level when sampled at the rising edge of a next adjacent even clock cycle, determining that the first even chip select clock signal is a valid signal, and the first even chip select clock signal has two pulses, wherein the rising edge of the first pulse in the first even chip select clock signal is configured to generate the rising edge of the first target command signal, and the rising edge of the second pulse in the first even chip select clock signal is configured to generate the falling edge of the first target command signal;
or,
in response to the target mode being the 1N MODE, and the initial chip select signal comprising a pulse with a pulse width that is twice the preset clock cycle,
when the first chip select signal is at a low level when sampled at the rising edge of an even clock cycle and still at the low level when sampled at the rising edge of a next adjacent odd clock cycle, determining that the second odd chip select clock signal is a valid signal, and the second odd chip select clock signal has two pulses, wherein the rising edge of the first pulse in the second odd chip select clock signal is configured to generate the rising edge of the second target command signal, and the rising edge of the second pulse in the second odd chip select clock signal is configured to generate the falling edge of the second target command signal,
when the first chip select signal is at a low level when sampled at the rising edge of an odd clock cycle and still at the low level when sampled at the rising edge of a next adjacent even clock cycle, determining that the second even chip select clock signal is a valid signal, and the second even chip select clock signal has two pulses, wherein the rising edge of the first pulse in the second even chip select clock signal is configured to generate the rising edge of the second target command signal, and the rising edge of the second pulse in the second even chip select clock signal is configured to generate the falling edge of the second target command signal,
or,
in response to the target mode being the 2N MODE, and the initial chip select signal comprising two pulses, each with a pulse width of the preset clock cycle,
when the first chip select signal is at a low level when sampled at the rising edge of two consecutive even clock cycles and at a high level when sampled at the rising edge of the odd clock cycle between the two consecutive even clock cycles, determining that the second odd chip select clock signal is a valid signal, and the second odd chip select clock signal has two pulses, wherein the rising edge of the first pulse in the second odd chip select clock signal is configured to generate the rising edge of the second target command signal, and the rising edge of the second pulse in the second odd chip select clock signal is configured to generate the falling edge of the second target command signal,
when the first chip select signal is at a low level when sampled at the rising edge of two consecutive odd clock cycles and at a high level when sampled at the rising edge of the even clock cycle between the two consecutive odd clock cycles, determining that the second even chip select clock signal is a valid signal, and the second even chip select clock signal has two pulses, wherein the rising edge of the first pulse in the second even chip select clock signal is configured to generate the rising edge of the second target command signal, and the rising edge of the second pulse in the second even chip select clock signal is configured to generate the falling edge of the second target command signal.

19. A semiconductor memory device, comprising a signal sampling circuit, comprising a signal input circuit, a mode selection circuit, a first clock processing circuit, a second clock processing circuit and a command decoding circuit, wherein
the signal input circuit is configured to determine a to-be-processed command signal and a to-be-processed chip select signal according to a first clock signal, a first chip select signal and a first command address signal, a clock cycle of the first clock signal being twice a preset clock cycle,
wherein the mode selection circuit is configured to perform, in response to a mode selection signal indicating a target mode, selection processing on the first clock signal and the to-be-processed chip select signal according to the mode selection signal, to obtain a target mode clock signal and a target mode chip select signal,
wherein the first clock processing circuit is configured to perform, when the first chip select signal includes a pulse with a pulse width of the preset clock cycle, sampling and logic operation on the to-be-processed chip select signal and the target mode chip select signal according to the target mode clock signal, to obtain a first chip select clock signal,
wherein the second clock processing circuit is configured to perform, when the first chip select signal includes a pulse with a pulse width that is twice the preset clock cycle, or the first chip select signal includes two pulses, each with a pulse width of the preset clock cycle, sampling and logic operation on the to-be-processed chip select signal and the target mode chip select signal according to the target mode clock signal, to obtain a second chip select clock signal, and wherein the command decoding circuit is configured to perform decoding and sampling on the to-be-processed command signal according to the to-be-processed chip select signal and the first chip select clock signal, to obtain a target command signal; or, perform decoding and sampling on the to-be-processed command signal according to the to-be-processed chip select signal and the second chip select clock signal, to obtain a target command signal.

20. The semiconductor memory device according to claim 19, wherein the semiconductor memory device is a Dynamic Random Access Memory (DRAM) chip and meets a DDR5 memory specification.

* * * * *